(12) United States Patent
Takaoka et al.

(10) Patent No.: US 7,627,610 B2
(45) Date of Patent: Dec. 1, 2009

(54) COMPUTER SYSTEM AND METHOD OF REPRODUCING DATA FOR THE SYSTEM

(75) Inventors: Nobumitsu Takaoka, Yokohama (JP); Yasunori Kaneda, Sagamihara (JP)

(73) Assignee: Hitachi, Ltd., Tokyo (JP)

( * ) Notice: Subject to any disclaimer, the term of this patent is extended or adjusted under 35 U.S.C. 154(b) by 390 days.

(21) Appl. No.: 11/342,833

(22) Filed: Jan. 31, 2006

(65) Prior Publication Data

US 2007/0180211 A1   Aug. 2, 2007

(30) Foreign Application Priority Data

Nov. 21, 2005   (JP) .............................. 2005-335655

(51) Int. Cl.
*G06F 12/00* (2006.01)
*G06F 17/30* (2006.01)

(52) U.S. Cl. ..................... 707/200; 707/10; 707/202; 707/204; 707/205

(58) Field of Classification Search ....................... None
See application file for complete search history.

(56) References Cited

U.S. PATENT DOCUMENTS

| | | | |
|---|---|---|---|
| 6,587,970 B1 * | 7/2003 | Wang et al. | 714/47 |
| 6,898,727 B1 * | 5/2005 | Wang et al. | 714/4 |
| 7,007,141 B2 * | 2/2006 | Li et al. | 711/162 |
| 7,058,731 B2 * | 6/2006 | Kodama | 710/5 |
| 7,181,581 B2 * | 2/2007 | Burkey | 711/161 |
| 7,281,031 B1 * | 10/2007 | Wang et al. | 709/213 |
| 7,337,331 B2 * | 2/2008 | Yoshida | 713/193 |
| 2002/0073109 A1 * | 6/2002 | Toriumi | 707/204 |
| 2004/0054939 A1 | 3/2004 | Guha | |
| 2004/0139129 A1 * | 7/2004 | Okuyama et al. | 707/204 |
| 2004/0257857 A1 * | 12/2004 | Yamamoto et al. | 365/154 |
| 2005/0060505 A1 * | 3/2005 | Kasako et al. | 711/162 |
| 2006/0047906 A1 * | 3/2006 | Umemura | 711/114 |

FOREIGN PATENT DOCUMENTS

| | | |
|---|---|---|
| JP | 2005-018506 | 1/2005 |
| JP | 2005-157710 | 6/2005 |

* cited by examiner

*Primary Examiner*—Tim T. Vo
*Assistant Examiner*—Jay A Morrison
(74) *Attorney, Agent, or Firm*—Antonelli, Terry, Stout & Kraus, LLP.

(57) ABSTRACT

A computer system includes a first storage system having a first logical volume; a second storage system connected to the first storage system and having a second logical volume and a third logical volume; and a superior device connected to the first storage system. The superior device includes a transmitter. The first storage system includes a first processing unit that records data in the first logical volume and generates update data including the data. The second storage system includes a power supply control unit that turns on a storage device which forms the second logical volume and an arbitration unit that records the update data in the second logical volume, at a timing when the update data is received from the first storage system, if the storage device which forms the second logical volume is turned off. The second storage system includes a second processing unit.

22 Claims, 13 Drawing Sheets

| HDD GROUP ID | STARTING HDD | THE NUMBER OF HDDS | RAID LEVEL |
|---|---|---|---|
| 111 | 111 | 4 | 5 |
| 115 | 115 | 4 | 5 |

104

204

| HDD GROUP ID | STARTING HDD | THE NUMBER OF HDDS | RAID LEVEL |
|---|---|---|---|
| 211 | 211 | 4 | 5 |
| 215 | 215 | 4 | 5 |

106

| UPDATE DATA GROUP ID | UPDATE DATA GROUP STATE | PAIR ID | UPDATE DATA LOGICAL VOLUME ID | UPDATE NUMBER |
|---|---|---|---|---|
| 1 | NORMAL | 1 | 124 | 50 |

206

| UPDATE DATA GROUP ID | UPDATE DATA GROUP STATE | PAIR ID | UPDATE DATA LOGICAL VOLUME ID | UPDATE NUMBER | MAIN THRESHOLD VALUE | SUB THRESHOLD VALUE |
|---|---|---|---|---|---|---|
| 1 | NORMAL | 1 | 224 | 40 | 75 | 75 |

FIG.11

| PAIR ID | PAIR STATE | MAIN STORAGE SYSTEM ID | MAIN LOGICAL VOLUME ID | SUB STORAGE SYSTEM ID | SUB LOGICAL VOLUME ID | UPDATE DATA GROUP ID |
|---|---|---|---|---|---|---|
| 1 | NORMAL | 1 | 121 | 2 | 221 | 1 |

| UPDATE DATA GROUP ID | WRITE ADDRESS | READ ADDRESS |
|---|---|---|
| 1 | 124:500 | 124:400 |

| UPDATE DATA GROUP ID | WRITE ADDRESS | READ ADDRESS |
|---|---|---|
| 1 | 224:100 | 224:100 |

| HDD ID | FINAL ACCESS TIME | THE NUMBER OF TIMES POWER IS TURNED ON |
|---|---|---|
| 211 | 7/21 0:05 | 2 |
| 215 | 7/20 23:36 | 4 |
| 230 | 5/4 0:00 | 0 |
| 231 | 5/6 0:00 | 0 |

| UPDATE NUMBER | PAIR ID | ADDRESS | DATA LENGTH | WRITE DATA |
|---|---|---|---|---|

800

COMPUTER SYSTEM AND METHOD OF REPRODUCING DATA FOR THE SYSTEM

The present application is based on and claims priority of Japanese patent application No. 2005-335655 filed on Nov. 21, 2005, the entire contents of which are hereby incorporated by reference.

BACKGROUND

The present invention relates to computer systems including a plurality of storage systems. More particularly, the present invention relates to a computer system that has a remote copy function of copying data stored in a storage system into another storage system and that is capable of controlling power supply to a storage device to suppress the power consumption and to a method of reproducing data for the computer system.

Two technologies including remote copy and power supply control for a storage device will be described as related arts of the present invention.

First, the remote copy will be described.

The remote copy is a technology of copying data (original data) written in a storage system by a superior device, such as a computer, into another storage system. Such a technology is required for disaster recovery (recovery of an information system destroyed by large scale natural disaster) and data backup.

One remote copy technology disclosed in Japanese Unexamined Patent Application Publication No. 2005-18506 (Patent Document 1) will now be described. It is assumed that a computer system includes the following three components:
(1) a computer,
(2) a first storage system, which is connected to the computer and in which the computer records data that is modified by the computer (the data is referred to as original data), and
(3) a second storage system that is connected to the first storage system and that stores a copy of the original data.

In the above computer system, the computer requests the first storage system to modify the original data. The first storage system generates information (a journal) concerning update of the original data and temporarily stores the generated journal in a storage area of the first storage system. The second storage system requests the first storage system to transmit the journal and updates the copy with the received journal.

The second storage system acquires the journal from the storage area asynchronously with access from the computer (journal read) in order to prevent performance deterioration due to the remote copy in access to the original data by the computer.

A function of copying data of the storage system by the remote copy technology is hereinafter simply referred to as the remote copy. A storage system having original data to be copied recorded therein is referred to as a main storage system, and a storage system in which the copied data is recorded is referred to as a sub storage system.

The remote copy in which data written by a superior device is simultaneously reflected in the original data and a copy of the original data is referred to as synchronous remote copy. The remote copy in which writing of data in the copy is not performed simultaneously with writing of the data in the original data is referred to as asynchronous remote copy.

Next, the power supply control for a storage device will be described.

The power supply control for a storage device is a technology of turning off the storage device in a storage system in accordance with the frequency of access to the storage device or the presence of the access to reduce the power consumed by the storage system and to extend a time period (hereinafter referred to as a mean life) before a failure of the storage device occurs.

The storage device is a device capable of recoding and reading out electronic data. A hard disk drive is exemplified as the storage device according to embodiments of the present invention. The power supply control includes strategies of reducing access delays caused by the storage device that is turned off, and of maintaining the state in which the storage device is turned off as much as possible.

One power supply control technology for a storage device is disclosed in Japanese Unexamined Patent Application Publication No. 2005-157710 (Patent Document 2).

In this power supply control technology, a storage system is provided with an interface through which an external computer that is connected to the storage system and that records data in the storage system can request turning on/off of a specified storage device (a logical volume (described below) is actually specified as the storage device). Specifically, the computer requests the storage system to turn off a storage device that is found not to be accessed for some time, among storage devices in the storage system, through the interface.

Another power supply control technology is disclosed in United States Patent No. 2004/0054939 (Patent Document 3).

A storage system basically turns off storage devices as long as the storage devices are not accessed. In order to increase the number of storage devices that is turned off, a data recording technology resulting from modification of Redundant Arrays of Inexpensive Disks (RAID) Level 4 is used. In order to reduce the access delays, a parity disk (a storage device in which error correction information is recorded) and a metadata disk (a storage device in which information concerning the structure inside the storage system and data cache are recorded), which disks adopt the above data recording technology, are always turned on.

When the remote copy is used to copy data recorded in the main storage system into the sub storage system, the storage device in which the copied data is recorded may be turned off while update of the storage device is not required. Accordingly, application of the power supply control technology for the storage device to the sub storage system will be reviewed.

In the technology disclosed in Patent Document 2, the computer instructs turning on/off of the storage device. Hence, the technology disclosed in Patent Document 2 is not appropriate for the asynchronous remote copy disclosed in Patent Document 1, that is, the remote copy in which copying of data is performed between the storage systems asynchronously with the access from the computer.

The technology disclosed in Patent Document 3 requires the storage devices that are always turned on. Such storage devices increase the power consumption in the storage system and shorten the mean life of the storage devices in the storage system.

SUMMARY

It is an object of the present invention to provide a computer system that adopts the remote copy and that is capable of turning on only a required storage device to reduce the power consumption in a sub storage system in order to extend the mean life of the storage devices.

According to an embodiment of the present invention, a computer system includes a first storage system having a first logical volume; a second storage system that is connected to the first storage system and that has a second logical volume and a third logical volume; and a superior device connected to the first storage system. The superior device includes a transmitter that transmits data to the first storage system. The first storage system includes a first processing unit that records the data in the first logical volume and generates update data including the data. The second storage system includes a power supply control unit that turns on a storage device which forms the second logical volume and an arbitration unit that records the update data in the second logical volume, at a timing when the update data is received from the first storage system, if the storage device which forms the second logical volume is turned off. The second storage system further includes a second processing unit that reads out the update data recorded in the second logical volume and records the readout update data in the third logical volume.

According to the present invention, it is possible to realize a computer system that adopts the remote copy and that is capable reducing the power consumption in the sub storage system to lengthen the mean life of the storage device.

BRIEF DESCRIPTION OF THE DRAWINGS

FIG. 11 is a table showing pair information in the main storage system;

FIG. 12 is a table showing update data group progress information in the main storage system;

FIG. 13 is a table showing update data group progress information in the sub storage system;

FIG. 14 is a table showing HDD power supply control information in the sub storage system;

FIG. 15 shows a format of update data;

DESCRIPTION OF THE PREFERRED EMBODIMENTS

Embodiments of the present invention will be described in detail with reference to the attached drawings.

First Embodiment

Figure 1:
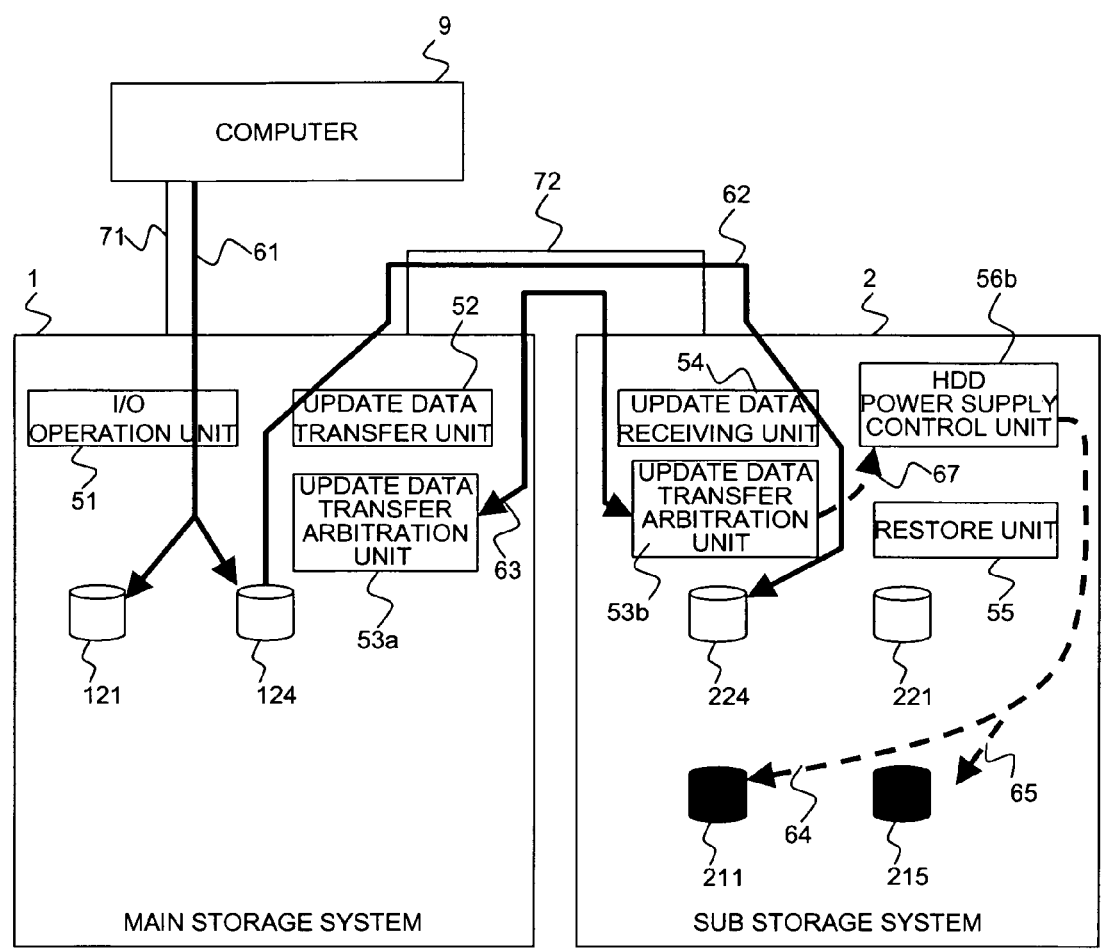
FIG. 1 shows an example of the logical structure of a computer system according to a first embodiment of the present invention.

FIG. 1 shows an example of the logical structure of a computer system according to a first embodiment of the present invention.

The computer system according to the first embodiment of the present invention includes a main storage system 1, a sub storage system 2, and a computer 9, which is a superior device.

The superior device means a device that requests a storage system to record data. A storage system is also superior device.

A communication path 71 is provided between the main storage system 1 and the computer 9. A communication path 72 is provided between the main storage system 1 and the sub storage system 2. Each of the communication paths 71 and 72 is realized by a network, such as a storage area network using Fibre Channel, a local area network (LAN), or a public switched network. The communication path 71 and the communication path 72 may be realized by the same network.

The main storage system 1 and the sub storage system 2 each include a plurality of hard disk drives (hereinafter denoted as HDDs), which are storage devices.

The main storage system 1 includes a plurality of logical volumes, such as a logical volume 121 and a logical volume 124, to which the HDDs are allocated. The logical volume 121 in the main storage system 1 can be accessed from the computer 9 as one block device. In other words, the computer 9 can write and read out data in and from the logical volume 121. The logical volume 124 in the main storage system 1 is used in the main storage system 1 in order to record update data (described below) of the logical volume 121. The computer 9 cannot access the logical volume 124.

The sub storage system 2 includes a plurality of logical volumes, such as a logical volume 221 and a logical volume 224. A copy of data recorded in the logical volume 121 in the main storage system 1 is recorded in the logical volume 221. The logical volume 224 is used in the sub storage system 2 in order to record the update data of the logical volume 121.

The update data is data used for applying the writing of the data from the superior device in the logical volume to the copy of the data recorded in a sub logical volume (described below). The update data is generated in the main storage system 1 and is transferred to the sub storage system 2. The update data includes the content of the written data, information used for identifying a pair (described below), information concerning the order of update of the data, and so on.

In the protocol for transferring the update data from the main storage system 1 to the sub storage system 2 in the first embodiment of the present invention, the sub storage system 2 "reads out" the update data from the main storage system 1.

In other words, the sub storage system 2 requests the main storage system 1 to transfer the update data to cause the main storage system 1 to transfer the update data to the sub storage system 2.

The sub storage system 2 includes a plurality of HDDs, such as an HDD 211 and an HDD 215. The storage areas of the HDD 211 (and three other HDDs) compose the logical volume 224 in the sub storage system 2. The storage areas of the HDD 215 (and three other HDDS) compose the logical volume 221 in the sub storage system 2. The storage areas of the HDDs are allocated also to the logical volumes in the main storage system 1. The HDDs other than the HDDs 211 and 215 are omitted in FIG. 1.

In order to identify each HDD in the storage system, an identification number (ID) unique in the storage system is assigned to each HDD.

The HDDs 211 and 215 are normally turned off and are turned on if it is required to record data in the logical volumes to which the HDDs 211 and 215 are allocated.

The data recorded in the logical volume 121 is copied to the logical volume 221 in the sub storage system 2 by the remote copy function of the main storage system 1 and the sub storage system 2.

The logical volume having the original data to be copied recorded therein is hereinafter referred to as a main logical volume, and the logical volume having a copy of the original data recorded therein is hereinafter referred to as a sub logical volume.

The relationship between the main logical volume 121 and the sub logical volume 221 is called a pair.

A manager (hereinafter referred to as a user) of the computer system can instruct the main storage system 1 or the sub storage system 2 to establish the pair of the main logical volume 121 and the sub logical volume 221. If the establishment of the pair is instructed, the main storage system 1 and the sub storage system 2 record the pair of the main logical volume 121 and the sub logical volume 221 in an internal shared memory as pair information.

The instruction to establish the pair can be issued through a management terminal for managing the main storage system 1 or the sub storage system 2. Although the management terminal is omitted in FIG. 1, such a mechanism is known to persons skilled in the art.

In the remote copy between the main storage system 1 and the sub storage system 2, the logical volumes 124 and 224 in which the update data is temporarily recorded are. used. The logical volume in which the update data is recorded is referred to as an update data logical volume. In addition, the update data logical volume in the main storage system 1 is referred to as a main update data logical volume, and the update data logical volume in the sub storage system 2 is referred to as a sub update data logical volume.

Application of the data written in the main logical volume 121 to the sub logical volume 221 by the use of the update data logical volume is performed in the following manner. When the computer 9 instructs the main storage system 1 to record data in the main logical volume 121, the main storage system 1 records the data in the main logical volume 121, generates update data, and records the generated update data in the main update data logical volume 124. Then, the main storage system 1 transfers the update data to the sub storage system 2 at certain timing. The sub storage system 2 records the received update data in the sub update data logical volume 224 and updates the data recorded in the sub logical volume 221 with the update data at certain timing.

Although the phrase "certain timing" is used, a process of determining this timing will be described in detail below. Since the data is updated in the manner described above, writing of the data in the main logical volume 121 from the computer 9 is applied to the sub logical volume 221 with time delay and the data in the sub logical volume 221 coincides with the data in the main logical volume 121 at a past point.

Such coincidence of the data is sometimes referred to as "coincidence" in this specification without being specifically denoted.

The above timing is determined independently of the process of recording the data in the main logical volume 121. Accordingly, the remote copy according to the first embodiment of the present invention is one aspect of the asynchronous remote copy.

Before the update process is performed, it is necessary to indicate to the main storage system 1 and the sub storage system 2 the correspondence of the main update data logical volume 124 to the sub update data logical volume 224, the correspondence of the main logical volume 121 to the main update data logical volume 124, and the correspondence of the sub logical volume 221 to the sub update data logical volume 224. The correspondence is indicated by the user through the management terminal, as in the establishment of the pair.

Immediately after the pair of the main logical volume 121 and the sub logical volume 221 is established, even part of the data in the main logical volume 121 is not copied into the sub logical volume 221. Accordingly, it is necessary to copy all the data in the main logical volume 121 into the sub logical volume 221. The copy of the data immediately after the pair is established is referred to as initial copy. Shift to the above update process after the initial copy allows the coincidence between the data in the main logical volume 121 and the data in the sub logical volume 221 to be maintained.

The main storage system 1 and the sub storage system 2 are instructed to start the initial copy by the user through the management terminal, as in the establishment of the pair. The instruction to establish the pair may include the instruction to start the initial copy.

A process of maintaining the coincidence between the main logical volume 121 and the sub logical volume 221 while controlling the power supply to the HDDs 211 and 215 in the sub storage system 2 (Flow F1) will now be described. It is assumed here that the initial copy has been performed between the main logical volume 121 and the sub logical volume 221 and that the HDDs 211 and 215 in the sub storage system 2 are turned off.

According to the first embodiment of the present invention, a timing when the update data is transferred is determined on the basis of the amount of the update data recorded in the main update data logical volume 124.

Flow F1

(F1-1) The computer 9 requests the main storage system 1 to write the data in the main logical volume 121. This request is processed by an input-output (I/O) operation unit 51.

(F1-2) The I/O operation unit 51 writes the data in the main logical volume 121 in response to the request to write the data, submitted from the computer 9, generates update data in response to the request, and writes the generated update data in the main update data logical volume 124.

The data flow in Steps F1-1 and F1-2 is shown by an arrow 61 in FIG. 1.

(F1-3) An update data transfer arbitration unit 53b in the sub storage system 2 (hereinafter referred to as an update data transfer arbitration unit (sub) 53b) periodically acquires a usage rate of the main update data logical volume 124 from an update data transfer arbitration unit 53a (hereinafter referred to as an update data transfer arbitration unit (main) 53a) (shown by an arrow 63). If the usage rate of the main update data logical volume 124 is higher than or equal to a predetermined threshold value, it is determined that the update data recorded in the main update data logical volume 124 is acquired from the main storage system 1.

(F1-4) Since the HDD 211 which forms the sub update data logical volume 224 is turned off, the sub update data logical volume 224 cannot record the received update data. Accordingly, the update data transfer arbitration unit (sub) 53b instructs an HDD power supply control unit 56b to turn on the HDD which forms the sub update data logical volume 224 (a broken-line arrow 67).

(F1-5) The HDD power supply control unit 56b receives the instruction to turn on the HDD 211 (a broken-line arrow 64).

(F1-6) After the HDD 211 is turned on and the data can be recorded in the sub update data logical volume 224, the update data transfer arbitration unit (sub) 53b instructs an update data receiving unit 54 to acquire the update data.

(F1-7) The update data receiving unit 54 receives the instruction and instructs an update data transfer unit 52 in the main storage system 1 to transfer the update data recorded in the main update data logical volume 124. The update data transfer unit 52 receives the instruction and transfers the update data recorded in the main update data logical volume 124. The update data receiving unit 54 records the received update data in the sub update data logical volume 224.

(F1-8) If the usage rate of the sub update data logical volume 224 is higher than or equal to a predetermined threshold value, the update data is applied to the sub logical volume 221.

When the update data is applied to the sub logical volume 221, the update data transfer arbitration unit (sub) 53b instructs a restore operation unit 55 to apply the update data. Since the HDD which forms the sub logical volume 221 is turned off, the update data transfer arbitration unit (sub) 53b instructs the HDD power supply control unit 56b to turn on the HDD which forms the sub logical volume 221.

(F1-9) The HDD power supply control unit 56b receives the instruction to turn on the HDD 215 (a broken-line arrow 65).

(F1-10) The restore operation unit 55 receives the instruction issued by the update data transfer arbitration unit (sub) 53b to apply the update data recorded in the sub update data logical volume 224 to the sub logical volume 221.

(F1-11) The sub storage system 2 turns off the HDD at an appropriate timing. This timing is determined on the basis of the presence of access to the HDD or the number of times the HDD is turned on.

The first embodiment of the present invention will be described in detail with reference to the drawings.

Figure 2:
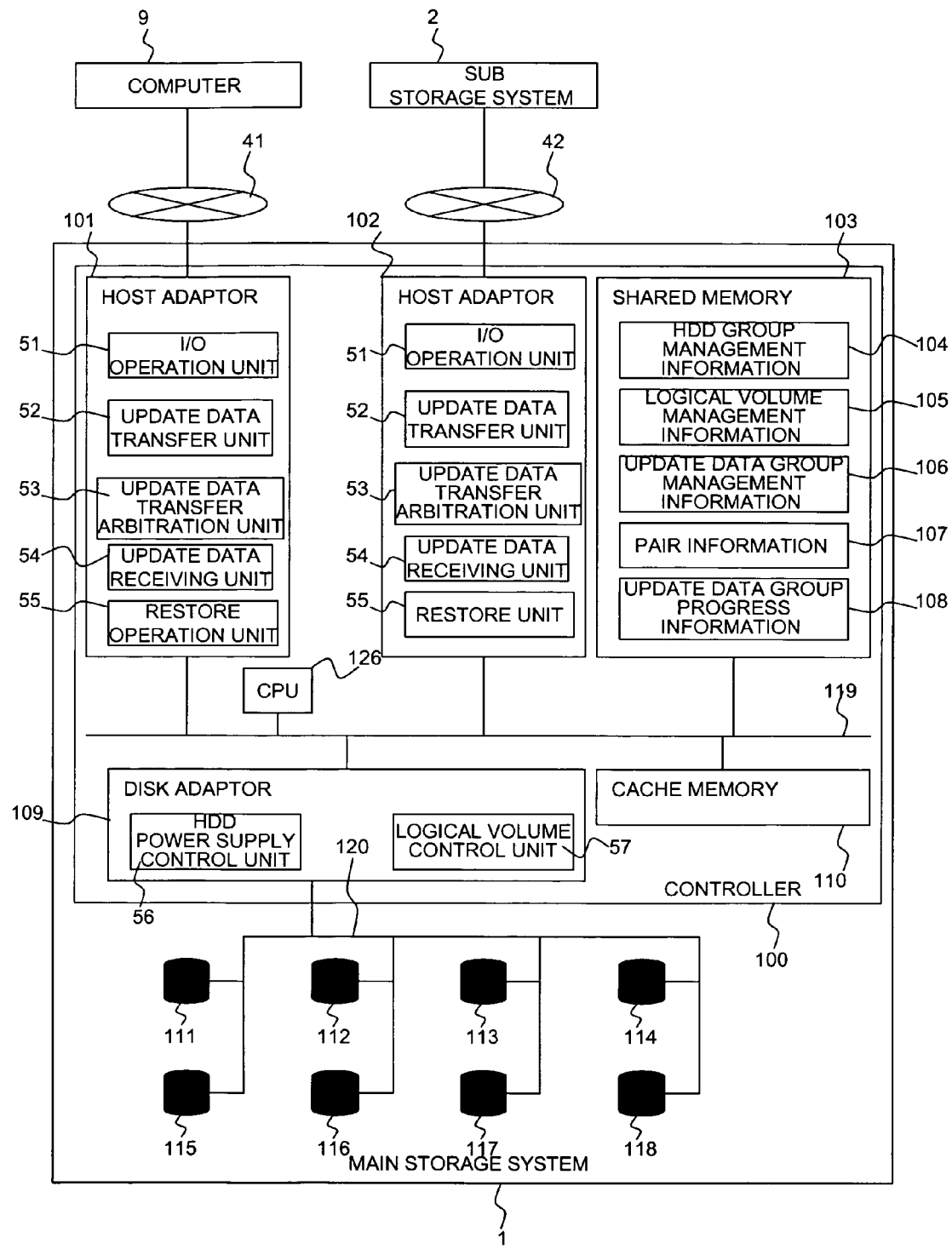
FIG. 2 shows an example of the structure inside a main storage system.

FIG. 2 shows an example of the structure inside the main storage system 1.

The main storage system 1 includes a controller 100 including host adaptors 101 and 102, a disk adaptor 109, a shared memory 103, and a cache memory 110, and HDDs 111, 112, 113, 114, 115, 116, 117, and 118. The host adaptors 101 and 102, the disk adaptor 109, the shared memory 103, and the cache memory 110 are connected to a CPU 126 via a bus 119 and are capable of communicating with each other. The disk adaptor 109 is connected to the eight HDDs 111 to 118 via an HDD connection line 120 and this connection allows the HDDs to be controlled (reading and writing of data and turning on/off of the power).

The host adaptors 101 and 102 each include the I/O operation unit 51, the update data transfer unit 52, the update data transfer arbitration unit 53, the update data receiving unit 54, and the restore operation unit 55. These units are embodied by programs that can be executed by the CPU 126 and the programs in the host adaptors 101 and 102 are executed by the CPU 126 in the controller 100 in order to perform a process relating to writing and reading of data performed by the host adaptor 101 and the host adaptor 102, requested from a superior device, and transfer of the update data.

Although the process relating to writing and reading of data performed by the host adaptor 101 and the host adaptor 102, requested from a superior device, and transfer of the update data is performed by the CPU 126 in the controller 100 in FIG. 2, the CPUs and memories may be provided in the host adaptors 101 and 102 and the programs in the I/O operation unit 51, the update data transfer unit 52, the update data transfer arbitration unit 53, the update data receiving unit 54, and the restore operation unit 55 may be executed by the CPUs in the host adaptors 101 and 102 to perform the process relating to writing and reading of data, requested from a superior device, and transfer of the update data.

In addition, the I/O operation unit 51, the update data transfer unit 52, the update data transfer arbitration unit 53, the update data receiving unit 54, and the restore operation unit 55 in each of the host adaptors 101 and 102 may be embodied by hardware components, such as IC chips, and the hardware components may be connected to each other via a logical control circuit to realize the host adaptors 101 and 102 as the hardware components capable of being independently operated.

The host adaptor 101 is connected to a network 41. The communication path 71 in FIG. 1 corresponds to the network 41. The host adaptor 102 is connected a network 42. The communication path 72 in FIG. 1 corresponds to the network 42. The network 41 may be the same network as the network 42.

The disk adaptor 109 performs power control for the HDDs and control of the logical volumes.

The HDD power supply control unit 56 and a logical volume control unit 57 in the disk adaptor 109 may be embodied by programs that are executed by a CPU and a memory. Or, the CPU and the memory, which are provided in the disk adaptor 109, may execute the programs in the HDD power supply control unit 56 and the logical volume control unit 57. Alternatively, the HDD power supply control unit 56 and the logical volume control unit 57 in the disk adaptor 109 may be hardware components.

The shared memory 103 is a memory to which the CPU 126 in the controller 100 or the host adaptors 101 and 102 and the disk adaptor 109 can access. The shared memory 103 has HDD group management information 104, logical volume management information 105, update data group management information 106, pair information 107, and update data group progress information 108 recorded therein.

Information concerning an HDD group in the main storage system 1 is recorded in the HDD group management information 104. The HDD group is a collection of HDDs including redundant data used for recovering the data recorded in the HDDs in failure of the HDDs. According to the first embodiment of the present invention, the HDDs in the HDD group are regarded as continuous storage areas and the storage areas are divided into subareas. The subareas correspond to the logical volumes.

Information concerning the structure of the logical volumes in the main storage system 1 is recorded in the logical volume management information 105.

Information concerning the update data logical volumes in the main storage system 1 and an update data group is recorded in the update data group management information 106. The update data group is used for managing the correspondence between the main update data logical volume 124 in main storage system 1 and the sub update data logical volume 224 in sub storage system 2 and the pairs including the main logical volume 121 and the sub logical volume 221, established on the basis of the correspondence.

Information concerning the pairs in the main storage system 1 is recorded in the pair information 107.

The address of the main update data logical volume 124 in which the update data is recorded and the address of the main update data logical volume 124 reading out the update data to be transferred to the sub storage system 2 are recorded in the update data group progress information 108.

The cache memory 110 is used for transferring the data between the host adaptors 101 and 102 and the disk adaptor 109. The cache memory 110 also serves as a cache area used for processing access requests to the logical volumes, submitted from the superior device, such as the computer 9, at a high speed (in a short response time).

Figure 3:
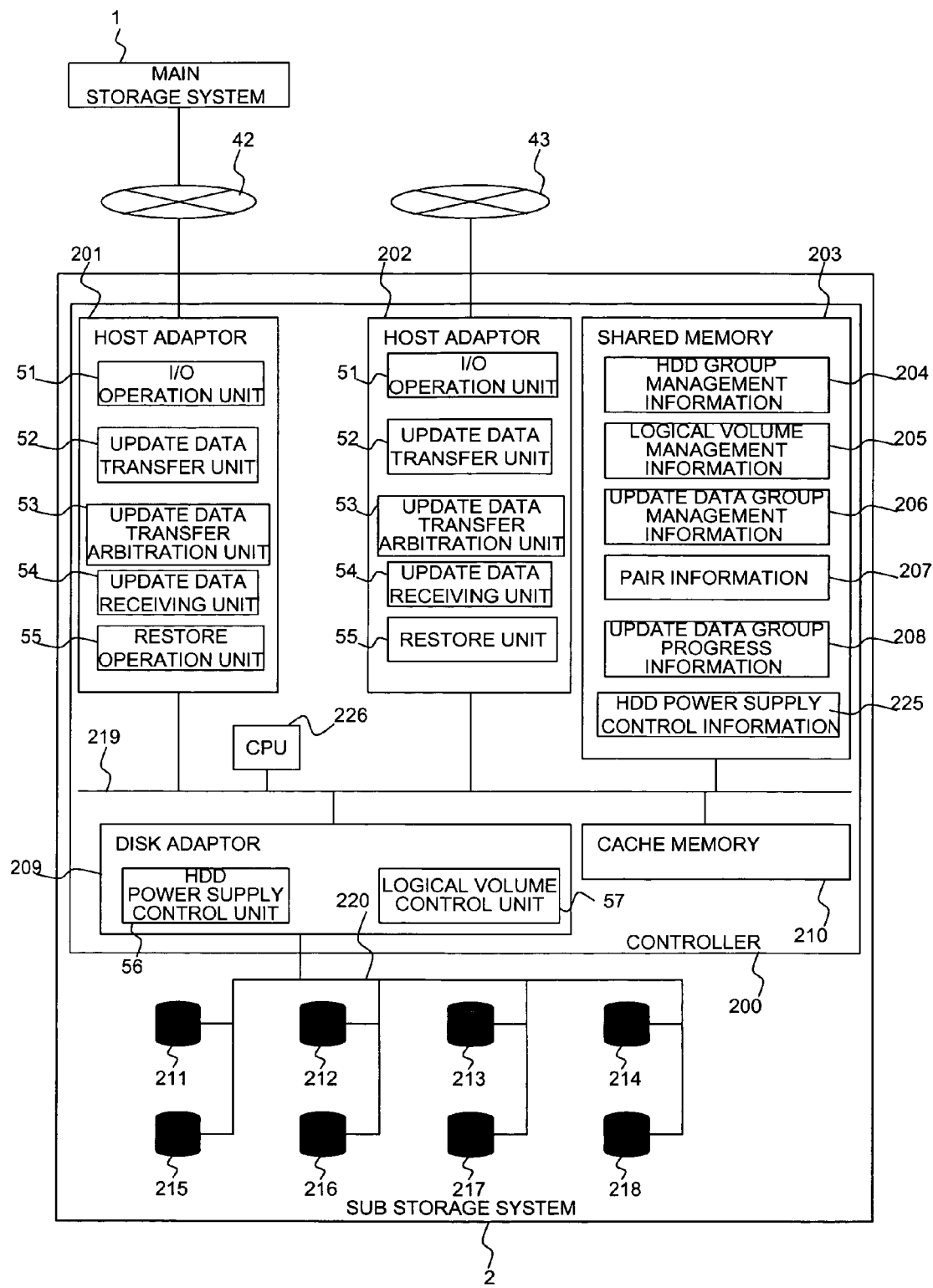
FIG. 3 shows an example of the structure inside a sub storage system.

FIG. 3 shows an example of the structure inside the sub storage system 2. The sub storage system 2 has a structure substantially similar to that of the main storage system 1. The sub storage system 2 includes a controller 200 including host adaptors 201 and 202, a disk adaptor 209, a shared memory 203, and a cache memory 210, and HDDs 211, 212, 213, 214, 215, 216, 217, and 218. The host adaptors 201 and 202, the disk adaptor 209, the shared memory 203, and the cache memory 210 are connected to a CPU 226 via a bus 219 and are capable of communicating with each other. The disk adaptor 209 is connected to the eight HDDs 211 to 218 via an HDD connection line 220 and this connection allows the HDDs to be controlled (reading and writing of data and turning on/off of the power).

The components in the sub storage system 2 operate similarly to those in the main storage system 1. The components in the sub storage system 2 is structured so as to be capable of control by the CPU 226 in the controller 200, control by the CPUs provided in the host adaptors 201 and 202, or control by the host adaptors 201 and 202, which are hardware components, as in the main storage system 1.

The sub storage system 2 differs from the main storage system 1 in that HDD power supply control information 225 is recorded in the shared memory 203 in the controller 200 and that the host adaptor 201 is connected to the main storage system 1 via the network 42 and the host adaptor 202 is connected to a network 43.

Figure 4:
FIG. 4 is table showing the content of logical volume management information in the main storage system.

FIG. 4 is table showing the content of the logical volume management information 105 in the main storage system 1. Information concerning the structure of the logical volumes in the main storage system 1 is recorded in the logical volume management information 105.

The information concerning one logical volume includes a logical volume ID, a logical volume type, a logical volume state, a capacity, and a physical address.

The logical volume ID is an ID for identifying a logical volume in the storage system. According to the first embodiment of the present invention, the logical volume ID is a unique integer number that is not duplicated in the storage system. For descriptive purpose, the logical volume IDs coincides with the reference numbers in FIG. 1 in this specification (some logical volumes are not shown in FIG. 1).

The logical volume type is a numerical value indicating the application of the logical volume. The logical volume type is represented by "host (10)", "main update data (20)", or "sub update data (21)" (numbers in parentheses denote corresponding numerical values). For the logical volume accessed from the computer 9, the logical volume type is represented by "host (10)". For the main update data logical volume, the logical volume type is represented by "main update data (20)". For the sub update data logical volume, the logical volume type is represented by "sub update data (21)".

If the logical volume is the main logical volume in a pair, one is added to the value of the logical volume type. If the logical volume is the sub logical volume in a pair, two is added to the value of the logical volume type.

For descriptive purpose, the logical volume type is represented by "host", "host (main)", "host (sub)", "update data (main)", or update data (sub)", instead of the numerical value, in the drawings in this specification.

The logical volume state is a numerical value indicating the state of the logical volume. The logical volume state is represented by "normal (1)" or "abnormal (2)" (numbers in parentheses denote corresponding numerical values). For descriptive purpose, the logical volume state is represented by "normal" or "abnormal", instead of the numerical value, in the drawings in this specification.

The logical volume state "normal" means that data can be correctly recorded in the logical volume and data can be correctly read out from the logical volume. The logical volume state "abnormal" means that the logical volume is not in the normal state. The abnormal state of the logical volume is caused by a failure of, for example, the HDD.

The capacity indicates a maximum amount of data can be recorded in the logical volume.

The physical address indicates an ID of the HDD group which forms the logical volume and a starting address of the logical volume in the HDD group. The physical address is represented by a format "HDD group ID:starting address" in FIG. 4. The ID of the HDD group is identical to the ID of the first HDD in the HDD group.

In the example shown in FIG. 4, the main logical volume 121 is a logical volume accessed from the computer 9, is the main logical volume 121 in a pair, has the logical volume state "normal", and has the capacity "100 GB". The data in the main logical volume 121 is stored from the head (address 0) of the HDD group 111. Information concerning the structures of other logical volumes 124, 122, and 123 is also recorded in the logical volume management information 105.

Figure 5:
FIG. 5 is a table showing the content of logical volume management information in the sub storage system.

FIG. 5 is a table showing the content of the logical volume management information 205 in the sub storage system 2. Since the data format of the logical volume management information 205 is the same as that of the logical volume management information 105, a description is omitted herein.

Figures 6, 7, 8, 9, 10:
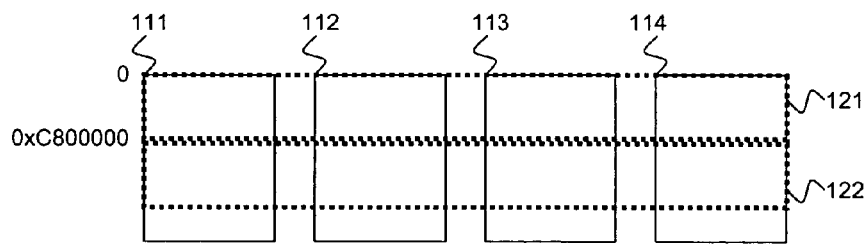
FIG. 6 is a table showing HDD group management information in the main storage system.
FIG. 7 shows an example of the structure of one HDD group in the main storage system.
FIG. 8 is a table showing HDD group management information in the sub storage system.
FIG. 9 is table showing update data group management information in the main storage system.
FIG. 10 is a table showing update data group management information in the sub storage system.

FIG. 6 is a table showing the HDD group management information 104 in the main storage system 1. The structure information of each HDD group in the main storage system 1 is recorded in the HDD group management information 104.

The structure information of each HDD group includes an HDD group ID, a starting HDD, the number of HDDs, and a RAID level.

The HDD group ID is an ID uniquely assigned to each HDD group in the storage system.

The starting HDD is the HDD ID of an HDD having the smallest ID among the HDDs in the HDD group. For descriptive purpose, the HDD group ID is identical to the starting HDD.

The number of HDDs denotes the number of HDDs in the HDD group. According to the first embodiment of the present invention, every HDD group includes HDDs having continuous HDD IDs of the number denoted by the number of HDDS, starting from the HDD having the HDD ID denoted by the starting HDD.

The RAID level is a numeral indicating a level of the data redundancy method in the RAID, applied to the HDD group.

In the example shown in FIG. 6, the information concerning the HDD group having the HDD group ID "111", the starting HDD "111", the number of HDDs "4", and the RAID level "5" is recorded in the HDD group management information 104. The information concerning the HDD group having the HDD group ID "115" is also recorded in the HDD group management information 104.

FIG. 7 shows an example of the structure of the HDD group having the ID "111" and the logical volumes to which the HDD group is allocated. Referring to FIG. 7, solid-line rectangles shown by reference numerals 111, 112, 113, and 114 represent the storage areas of the HDDs 111, 112, 113, and 114, respectively. The addresses of the storage areas are numbered from top to bottom. Dotted-line rectangles shown by reference numerals 121 and 122 indicate that the storage areas of the HDDs 111, 112, 113, and 114 compose the logical volumes 121 and 122. The main logical volume 121 occupies an area corresponding to 100 GB from the first storage area in the HDD group, and the logical volume 122 occupies an area corresponding to 100 GB from a (logical) address 0?C800000 of the HDD group.

FIG. 8 is a table showing the HDD group management information 204 in the sub storage system 2. Since the HDD group management information 204 in the sub storage system 2 has the same format as that of the HDD group management information 104 in the main storage system 1, a description is omitted herein.

FIG. 9 is table showing the update data group management information 106 in the main storage system 1. Information concerning the structure of the update data group controlled by the main storage system 1 is recorded in the update data group management information 106.

The information concerning the structure of one update data group includes an update data group ID, an update data group state, a pair ID, an update data logical volume ID, and an update number.

The update data group ID is an ID for uniquely identifying the update data group in the main storage system 1 and the sub storage system 2.

The update data group state is a numerical value indicating the state of the update data group. The update data group state is represented by "normal(1)" or "abnormal(2)" (numbers in parentheses denote numerical values indicating the states). The update data group state "normal" means that writing of the update data in the update data logical volumes in the update data group, reading out of the update data from the update data logical volumes in the update data group, and transfer of the update data can be normally performed. The update data group state "abnormal" means that the above operations cannot be normally performed. The abnormal state of the logical volume group is caused by a failure of the HDD or the network.

For descriptive purpose, the update data group state is represented by "normal" or "abnormal", instead of the numerical value, in this specification.

The pair ID is an ID of the pair associated with the update data group. If a pair is associated with the update data group, the update data for the pair is recorded in the update data logical volumes in the associated update data group. The main storage system 1 and the sub storage system 2 use a common value as the pair ID in order to uniquely identify the pair.

The update data logical volume ID is the ID of an update data logical volume in the update data group. Multiple update data logical volumes may exist.

The update number is a number assigned to the update data finally recorded in the update data logical volume. Continuous unique numbers are assigned to the update data.

In the example shown in FIG. 9, the update data group having the update data group ID "1" has the state "normal", has the associated pair ID "1", and has the update data logical volume ID "124".

FIG. 10 is a table showing the update data group management information 206 in the sub storage system 2. Since the data format of the update data group management information 206 is the same as that of the update data group management information 106 in the main storage system 1, a description is omitted herein. However, the number of the update data to be read out from the update data logical volume is recorded in the update number of the update data group management information 206.

In addition, data on a main threshold value and a sub threshold value is added to the update data group management information 206. The main threshold value indicates a threshold value for the usage rate (in a unit of percent) of the main update data logical volume included in the update data group. The sub threshold value indicates a threshold value for the usage rate of the sub update data logical volume included in the update data group. These threshold values are used for determining whether the HDDs which form the sub update data logical volume and the sub update data logical volume are turned on. A process using these threshold values will be described in detail below with reference to FIGS. 18 and 19.

FIG. 11 is a table showing information concerning the pair recorded in the pair information 107 in the main storage system 1. The information concerning the structure of each pair between the logical volumes in the main storage system 1 and the sub storage system 2 is recorded in the pair information.

The pair information 107 includes a pair ID, a pair state, a main storage system ID, a main logical volume ID, a sub storage system ID, a sub logical volume ID, and an update data group ID of each pair.

The pair ID is an ID for uniquely identifying a pair in the logical volumes in the main storage system 1 and the sub storage system 2.

The pair state is a numerical value indicating the state of the pair. The pair state is represented by "normal(1)", "abnormal(2)", and "pause(3)" (numbers in parentheses denote corresponding numerical values). The pair state "normal" means that the update data in the pair can be normally transferred between the main storage system 1 and the sub storage system 2. The pair state "abnormal" means that the update data in the pair cannot be normally transferred between the main storage system 1 and the sub storage system 2 due to a failure of the HDD or the network. The pair state "pause" means that the data written in the main logical volume is not reflected in the sub logical volume. However, the update data that has not been transferred can be transferred between the main storage system 1 and the sub storage system 2.

For descriptive purpose, the pair state is represented by "normal", "abnormal", or "pause", instead of the numerical value, in this specification.

The main storage system ID is the ID of the main storage system 1 including the main logical volume in the pair. For descriptive purpose, the reference numeral 1 assigned to the main storage system 1 in FIG. 1 is shown as the ID of the main storage system 1 in this specification. Similarly, the reference numeral 2 assigned to the sub storage system 2 in FIG. 1 is shown as the ID of the sub storage system 2.

The main logical volume ID is the ID of the main logical volume in the pair.

The sub storage system ID is the ID of the sub storage system 2 including the sub logical volume in the pair.

The sub logical volume ID is the ID of the sub logical volume in the pair.

The update data group ID is the ID of the update data group associated with the pair.

In the example shown in FIG. 11, the pair having the pair ID "1" has the pair state "normal", the main storage system ID "1", the main logical volume ID "121", the sub storage system ID "2", the sub logical volume "221", and the update data group ID "1".

The information concerning the pair (having the ID "1") of the logical volume in the main storage system 2 with the logical volume in the main storage system 1 is recorded in the pair information 207 in the sub storage system 2 in the same format as the pair information 107 in the main storage system 1.

The logical volume types of the logical volume management information 105 and 205, the update data group management information 106 and 206, and the pair information 107 and 207 are updated on the basis of an instruction on the structure of the pair, issued by the user through the management terminal.

FIG. 12 is a table showing the update data group progress information 108 in the main storage system 1. The update data group progress information 108 is used for managing the progress of the transfer of the update data in each update data group (the update data group progress information 208 included in the sub storage system 2 is used for managing the progress of the application of the update data to the sub logical volume).

An update data group ID, a write address, and a read address are recorded for every update data group in the update data group progress information 108.

The update data group ID is the ID of the update data group.

The write address includes the ID of the update data logical volume in which the update data is to be recorded and the address of the update data logical volume.

The read address includes the ID of the update data logical volume from which the update data has finally read out and the address of the update data logical volume.

In the example shown in FIG. 12, the write address and the read address are recorded in a format "ID of update data logical volume: address of update data logical volume".

According to the first embodiment of the present invention, the update data logical volume is used in the same manner as in a so-called ring buffer. The write address is an address in which the subsequent update data is recorded and is incremented each time the update data is recorded in the address. The read address is an address from which the subsequent update data is read out and is incremented each time the update data is read out from the address. If such addresses exceed the capacity of the storage area in the update data group, the addresses are reset to an appropriate initial address.

If the update data group includes a plurality of update data logical volumes, the update data logical volumes are used in ascending order of the IDs as continuous storage areas.

In the example shown in FIG. 12, the update data group having the update data group "1" has the write address "124: 500" (address 500 of the update data logical volume 124) and the read address "124:400" (address 400 of the update data logical volume 124).

The usage rate of the update data group will now be described. The usage rate of the update data group means a rate of the amount of the update data that is actually recorded with respect to the maximum amount of the update data that can be recorded in the update data logical volume belonging to the update data group in the storage system. The usage rate is calculated for every storage system and is not calculated from the addition of the amount of the data in the main update data logical volume to that in the sub update data logical volume.

The maximum amount of the update data that can be recorded in the update data group is calculated from the sum of the capacities of the update data logical volumes in the update data group and the data length of the update data (the update data is fixed-length data, as described below). According to the first embodiment of the present invention, the update data that is read out from the update data logical volume and that is normally processed is discarded. The amount of the update data actually recorded in the update data group is calculated from the write address and the read address in the update data group progress information. The usage rate of the update data group is calculated from the maximum amount of the update data that can be recorded in the update data group and the amount of the update data actually recorded in the update data group.

FIG. 13 is a table showing the update data group progress information 208 in the sub storage system 2. Since the update data group progress information 208 has the same format as the update data group progress information 108 in the main storage system 1, a description is omitted herein.

FIG. 14 is a table showing the HDD power supply control information 225 in the sub storage system 2. An HDD ID, a final access time, and the number of times the power is turned on of each HDD in the sub storage system 2 are recorded in the HDD power supply control information 225.

The HDD ID is an ID for identifying the HDD.

The final access time is a time when the HDD has been finally accessed (writing or readout of data). The final access time is recorded each time the logical volume control unit 57 in the disk adaptor 209 accesses the HDD.

The number of times the power is turned on means the number of times the HDD that is turned off is turned on, and is set to a value no less than zero. This value is decreased at predetermined time intervals. The reason for the decrease will be described below. The decrease is performed by the HDD power supply control unit 56 in the disk adaptor 209.

FIG. 15 shows a data format 800 of the update data. The update data includes information concerning an update number, a pair ID, an address, a data length, and write data.

The update number represents a unique number among numbers continuously assigned to the update data. The update number of the update data is determined so as to be a value subsequent to the update number of the update data most recently generated in the generation of the update data. A maximum value is set for the values of the update numbers. If the update number exceeds the maximum value in the determination of the update number in the above manner, the update number is set to zero. The maximum value is set to a value that is not overlapped with the update numbers of the update data recorded in the update data logical volume.

The pair ID represents the ID of the pair including the sub logical volume to which the update data is applied.

The address represents the initial address to be updated, of the logical volume updated with the update data.

The data length represents an effective data length of write data included in the update data.

The write data represents the content of data written in the sub logical volume in the update.

Information including the update number, the pair ID, the address, and the data length is referred to as an update data header.

The update data is fixed-length data. If the amount of data including the update data header and the write data is larger than the size of the fixed-length update data, the write data is appropriately divided into two or more and two or more pieces of update data are generated. Conversely, if the amount of data including the update data header and the write data is smaller than the size of the fixed-length update data, the rest of the write data is embedded with zero.

Processes according to the first embodiment of the present invention will be described with reference to flowcharts.

Figure 16:
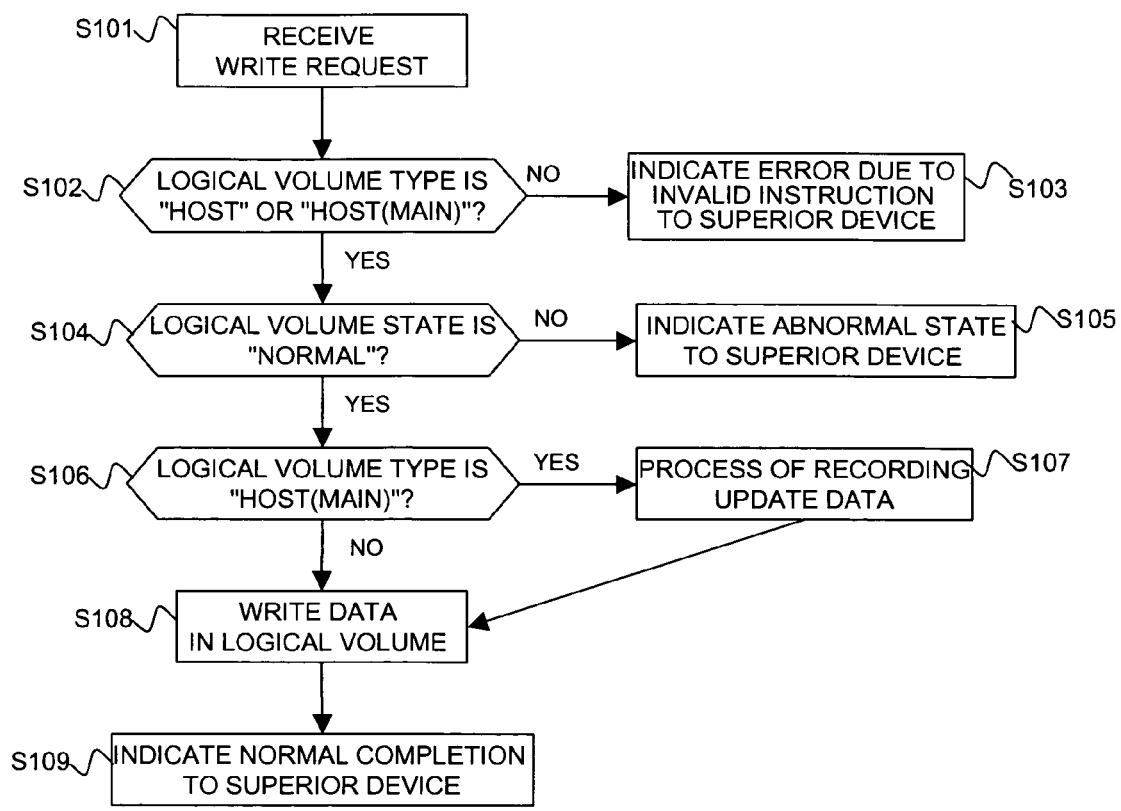
FIG. 16 is a flowchart showing a process in response to a write request from a superior device.

FIG. 16 is a flowchart showing a process when the I/O operation unit 51 in the main storage system 1 receives a request to write data from the computer 9.

When the host adaptor 101 in the main storage system 1 receives a request to write data from the computer 9, the I/O operation unit 51 in the host adaptor 101 starts the process from Step S101. The request from the computer 9 includes information specifying logical volumes to which the data is to be written, the write data and the data length thereof, and the address of a logical volume where the writing of data is started.

It is assumed in the following description that the computer 9 requests writing of data in the main logical volume 121. The I/O operation unit 51 hereinafter indicates the I/O operation unit 51 in the host adaptor 101, unless otherwise noted. A logical volume in which the computer 9 requests writing of data is referred to as a target logical volume.

In Step S101, the I/O operation unit 51 records the content of the request from the computer 9 in the cache memory 110. In Step S102, the I/O operation unit 51 determines whether the target logical volume is a logical volume in which data can be written. The logical volume in which data can be written indicates a logical volume having the logical volume type "host" or "host(main)". The determination is based on the information concerning the logical volume type of the logical volume 121, recorded in the logical volume management information 105 (refer to FIG. 4).

Referring to FIG. 4, the logical volume type of the logical volume 121 is "host(main)". In this case, the process proceeds to Step S104. If the logical volume type of the logical volume 121 is, for example, "host(sub)" other than "host(main)", then in Step S103, the I/O operation unit 51 indicates to the computer 9 that the request is invalid and the process terminates.

In Stet S104, the I/O operation unit 51 determines whether the logical volume state of the target logical volume is "normal". The determination is based on the information concerning the logical volume state of the logical volume 121, recorded in the logical volume management information 105.

Referring to FIG. 4, the logical volume state of the logical volume 121 is "normal". In this case, the process proceeds to Step S106. If the logical volume state of the logical volume 121 is "abnormal", then in Step S105, the I/O operation unit 51 indicates to the computer 9 that the state of the target logical volume is abnormal and the process terminates.

In Step S106, the I/O operation unit 51 determines whether the target logical volume is the main logical volume in a pair. The determination is based on the information concerning the logical volume type of the logical volume 121, recorded in the logical volume management information 105.

Referring to FIG. 4, the logical volume type of the logical volume 121 is "host(main)" and the logical volume 121 is the main logical volume in the pair. In this case, the process proceeds to Step S107. If the logical volume type of the logical volume 121 is not "normal(main)", the process proceeds to Step S108.

In Step S107, the I/O operation unit 51 generates update data in response to the request from the computer 9 and records the generated update data in the update data logical volume. This step will be described in detail below with reference to FIG. 17. In Step S108, the I/O operation unit 51 records the data specified by the computer 9 in the target logical volume. This step is performed by the logical volume control unit 57 in the disk adaptor 109. The I/O operation unit 51 indicates the address in the cache memory 110, at which the content of the request from the computer 9 is recorded in Step S101, and the request to write the data in the logical volume, to the logical volume control unit 57 in the disk adaptor 109. In response to this request, the logical volume control unit 57 in the disk adaptor 109 acquires the structure of the logical volume (the structure of the HDD) from the update data group management information 106, refers to the content of the request from the computer 9, recorded in the cache memory 110, and records the write data in the HDD which forms the logical volume 121.

In Step S109, the process indicates to the computer 9 that the process is normally completed and the process terminates.

Figure 17:
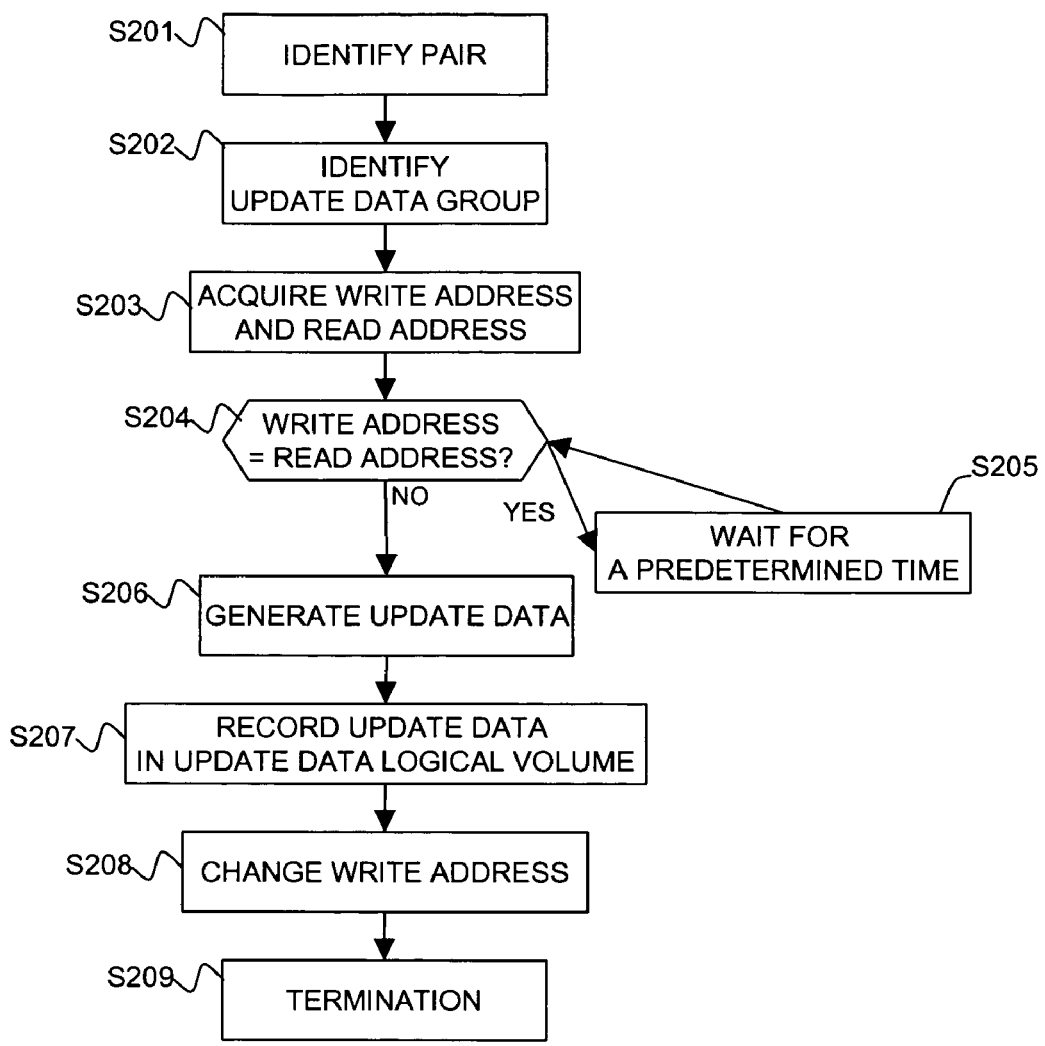
FIG. 17 is a flowchart showing a process of recording the update data in a main update data logical volume.

FIG. 17 is a flowchart showing the process in Step S107 in FIG. 16 (the process of recording the update data) in detail.

The process of recording the update data is started from Step S201. For simplicity, a description of a process when the logical volume and the update data logical volume are in the abnormal state is omitted.

In Step S201, the process identifies a pair including the target logical volume. The identification is based on the pair information 107 (refer to FIG. 11). The process searches the pair information 107 for a pair having the main logical volume ID "121".

In Step S202, the process identifies an update data group associated with the pair identified in Step S201. The update data group is identified by referring to the pair information 107.

In Step S203, the process acquires the write address and the read address of the update data group identified in Step S202 from the update data group progress information 108.

In Step S204, the process determines, from the write address and the read address acquired in Step S203, whether the update data logical volume included in the update data group has a free storage area sufficient to write the update data.

If the update data logical volume does not have a free storage area sufficient to write the update data, the process proceeds to Step S205. In Step S205, the process waits for the free space sufficient to write the update data for a predetermined time. Then, the process performs the determination in Step S204. As another method of process in case of insufficient free storage area, a process to change the pair state of the pair to "pause" and stop the recording of the update data, or a process to request the sub storage system 2 to acquire the update data may be adoptable.

In Step S206, the process generates the update data in response to the request to write the data from the computer 9 and records the generated update data in the cache memory 110.

A variety of information in the update data is determined in the following manner. The update number is set to the update number of the update data group identified in Step S202, recorded in the update data group management information 106. The pair ID is set to the ID of the pair identified in Step S201. The address is set to the address specified by the computer 9. The data length is set to the data length of the write data specified by the computer 9. The write data is set to the write data specified by the computer 9.

The above variety of information is acquired from the content of the request from the computer 9, recorded in the cache memory 110 in Step S101 in FIG. 16.

In Step S207, the I/O operation unit 51 instructs the logical volume control unit 57 in the disk adaptor 109 to record the update data, recorded in the cache memory 110, in the write address (the update data logical volume and the address thereof) acquired in Step S203. The logical volume control unit 57 in the disk adaptor 109 receives the instruction and writes the update data in the update data logical volume.

In Step S208, the I/O operation unit 51 changes the write address of the update data group, recorded in the update data group progress information 108, to a subsequent write address (the update data logical volume in which the subsequent update data is written and the address thereof). The I/O operation unit 51 sets the update number in the update data group management information 106 to the subsequent number. The subsequent write address is calculated by adding the data length of the update data to the current write address.

If the addition causes the write address to exceed a maximum value, the subsequent write address includes the first update data logical volume in the update data group and the initial address (0) of the first update data logical volume. The maximum value of the write address is determined by the capacity of the update data logical volume included in the update data group.

After the above steps are completed, in Step S209, the process terminates.

When the target logical volume belongs to a plurality of pairs, the above process is repeated for every pair.

Figure 18:
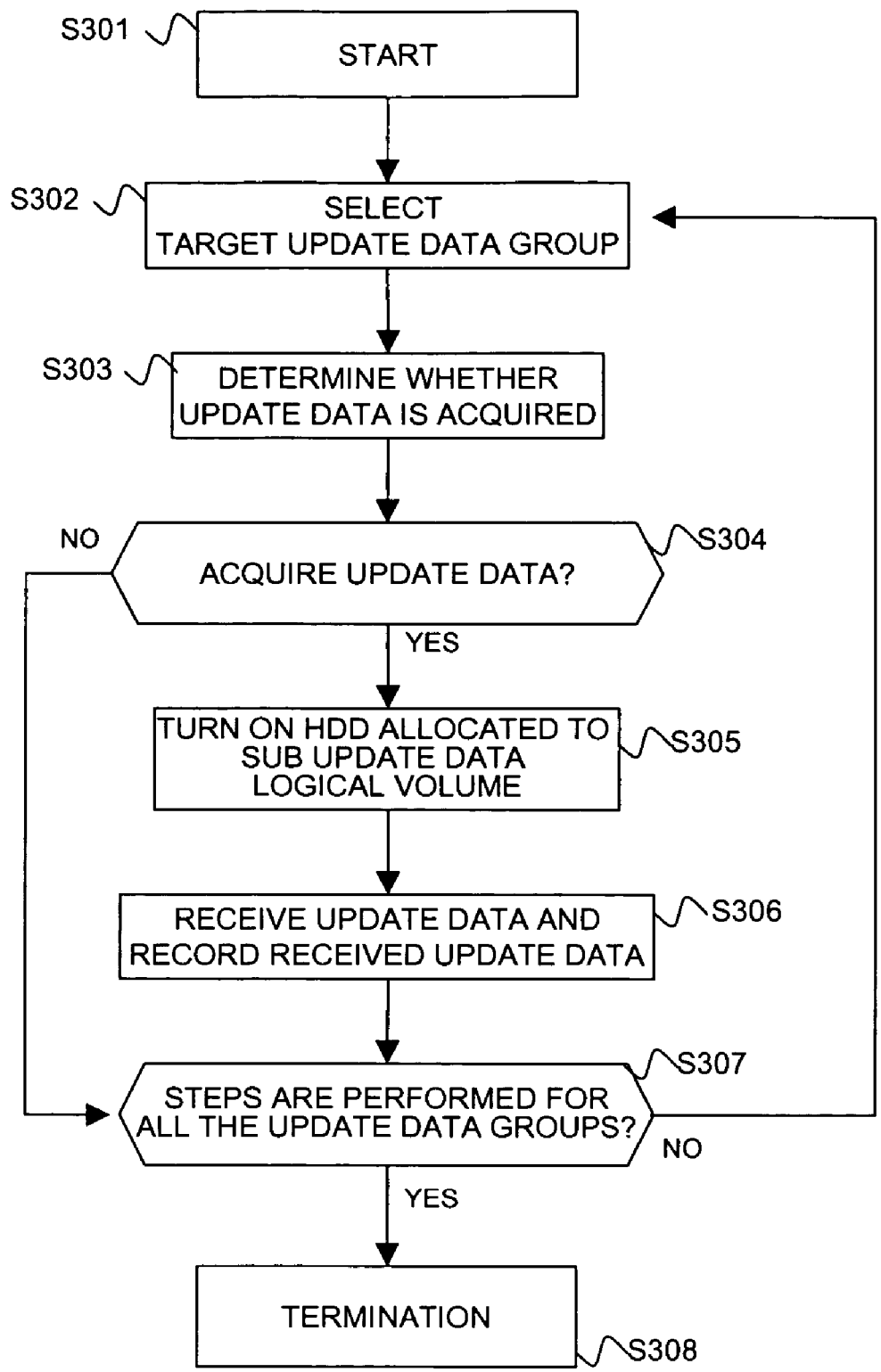
FIG. 18 is a flowchart showing a process of receiving the update data and recording the received update data in a sub update data logical volume.

FIG. 18 is a flowchart showing a process of acquiring the update data recorded in the main storage system 1 and recording the acquired update data in the sub update data logical volume (a process of acquiring the update data) in the sub storage system 2.

The process is performed in accordance with the state of the power supply of the HDD which forms the sub update data logical volume. This process is periodically performed for all the update data groups at predetermined time intervals by the update data transfer arbitration unit 53 in the sub storage system 2 (hereinafter referred to as the sub update data transfer arbitration unit).

The process of acquiring the update data is started from Step S301.

In Step S302, the process selects one update data group set in the sub storage system 2. The selected update data group is hereinafter referred to as a target update data group.

In Step S303, the process determines whether the update data in the target update data group is acquired from the main storage system 1. According to the first embodiment of the present invention, the determination is based on the usage rate of the target update data group in the main storage system 1. The step based on the usage rate will now be described.

The sub update data transfer arbitration unit acquires the usage rate of the target update data group in the main storage system 1 from the update data transfer arbitration unit 53 (hereinafter referred to as the main update data transfer arbitration unit) in the host adaptor 102 in the main storage system 1. The process determines whether the usage rate is higher than the main threshold value of the target update data group, recorded in the update data group management information 206. If the usage rate is higher than the main threshold value, the process acquires the update data. Otherwise, the process does not acquire the usage rate.

The main update data transfer arbitration unit calculates the usage rate from the write address and read address, recorded in the update data group progress information 108, and the sum of the capacities of the main update data logical volumes included in the update data group.

In Step S304, the process proceeds to Step S305 or Step S307 in accordance with the determination in Step S303.

In Step S305, the process turns on the HDD which forms the update data logical volume in which the update data is to be recorded. This step will now be described in detail.

The sub update data transfer arbitration unit identifies the update data logical volume in which the update data is to be recorded from the write address of the target update data group recorded in the update data group progress information 208. If each HDD in the update data logical volume is turned off, the sub update data transfer arbitration unit instructs the HDD power supply control unit 56 in the disk adaptor 209 to turn on the HDD. The HDD which forms the logical volume is acquired from the logical volume management information 205. The state of the power supply of each HDD is known to the HDD power supply control unit 56 in the disk adaptor 209, and the sub update data transfer arbitration unit inquires of the disk adaptor 209 about the state of the power supply of each HDD to know the state.

The HDD power supply control unit 56 in the disk adaptor 209 receives the instruction to turn on the HDD which forms the specified logical volume.

In Step S306, the process receives the update data from the main storage system 1 and writes the acquired update data in the update data logical volume. This step will now be described in detail.

The sub update data transfer arbitration unit requests the main update data transfer arbitration unit to transfer the update data in the target update data group. The main update data transfer arbitration unit receives the request and instructs the update data transfer unit 52 in the host adaptor 102 to transfer the update data in the target update data group. The update data transfer unit 52 indicates the update data transfer unit in the host adaptor 102, unless otherwise noted.

The update data transfer unit 52 transfers, to the sub storage system 2, the update data that is recorded in the main update data logical volume in the target update data group and that is subsequent to the update data that has been finally transferred to the sub storage system 2. The update data logical volume having such update data recorded therein and the address of the update data logical volume are determined from the read address in the update data group progress information 108.

If the update data is not included in the target update data group, the update data transfer unit 52 indicates to the sub storage system 2 that the update data does not exist. Upon completion of the transfer of the update data, the update data transfer unit 52 changes the value of the read address in the update data group progress information 108 to the address at which the transferred update data has been recorded.

The update data transmitted from the main storage system 1 and received in the sub storage system 2 in the manner described above is written in the update data logical volume by the update data receiving unit 54 in the host adaptor 201 in the sub storage system 2.

Since the process of receiving the update data and writing the received update data in an appropriate update data logical volume, performed by the update data receiving unit 54, is approximately the same as in Steps S203 to S209 in FIG. 17, a description is omitted herein. However, the update data transmitted from the main storage system 1 is recorded in the update data logical volume, without generating the update data in Step S206.

The process of receiving the update data in Step S306 is repeated until the usage rate of the main update data logical volume is, for example, on the order of 5% or less.

In Step S307, Steps S302 to S306 are performed for all the update data groups in the sub storage system 2. Specifically, in Step S307, the process determines whether Steps S302 to S306 are performed for all the update data groups in the sub storage system 2. If Steps S302 to S306 are performed for all the update data groups in the sub storage system 2, the process proceeds to Step S308. If Steps S302 to S306 are not performed for all the update data groups in the sub storage system 2, the process goes back to Step S302.

In Step S308, the process of acquiring the update data terminates.

Although the determination of whether the update data is acquired is based on the usage rate of the update data group in the main storage system 1 in Step S303, the determination may be based on the information or state managed by the sub storage system 2 to realize more effective power control of the HDD.

Excessive turning on/off of the HDD increases the load on a spindle motor due to spin-up and spin-down actions to shorten the life of the HDD. Accordingly, in order to decrease the number of times the HDD is turned on/off, the update data may be acquired, irrespective of the usage rate of the update data group in the main storage system 1, and the acquired update data may be recorded in the sub update data logical volume, if it is determined that the HDD which forms the sub update data logical volume has been already turned on.

Turning on of the HDD which forms the sub update data logical volume 224 can be caused by an access to another logical volume (for example, the logical volume 222) in the same HDD group. The above determination reflects this situation.

Figure 19:
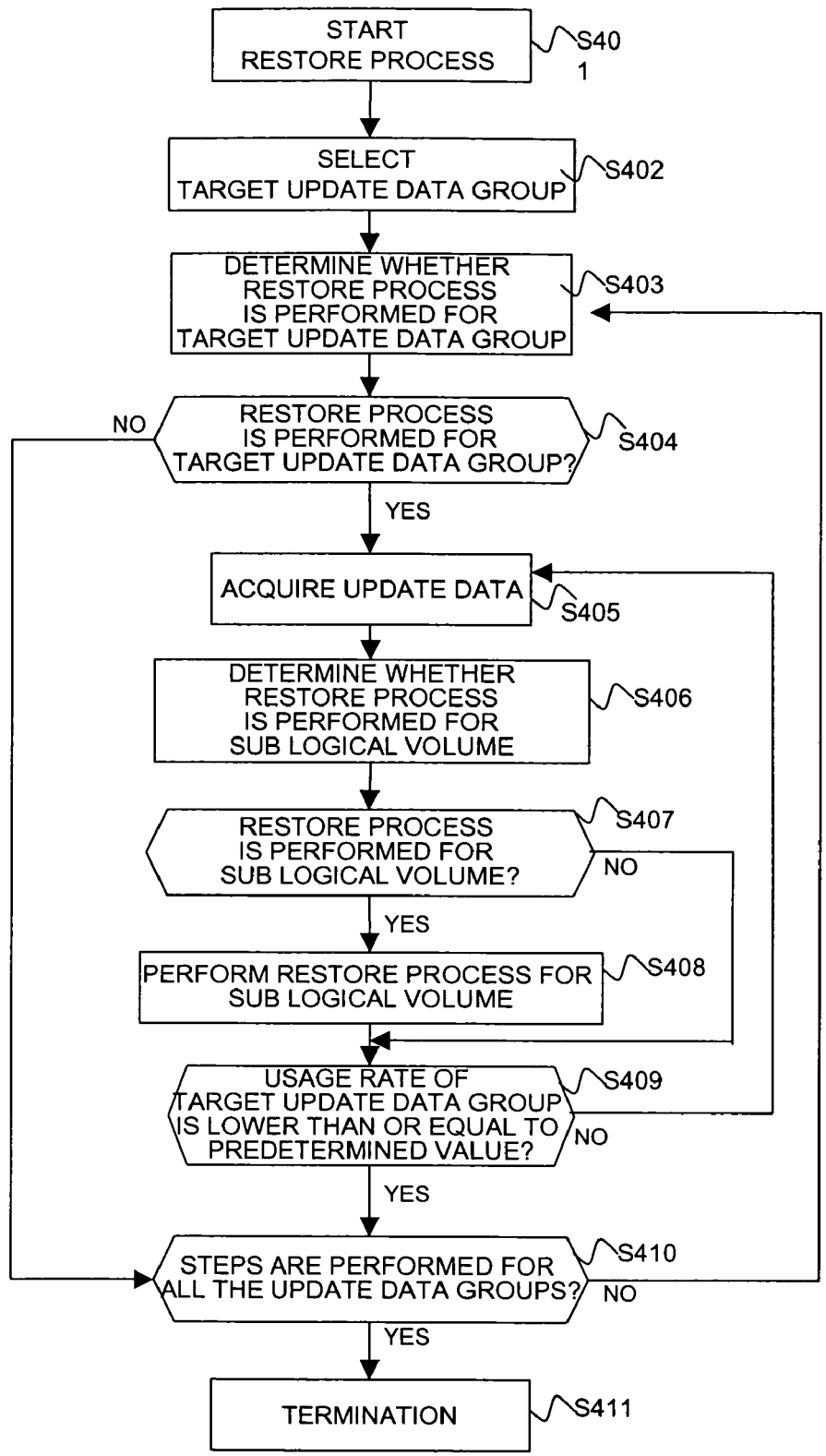
FIG. 19 is a flowchart showing a restore process of applying the update data recorded in an update data logical volume to data recorded in a sub logical volume.

FIG. 19 is a flowchart showing a process of applying the update data recorded in the update data logical volume to the data recorded in the sub logical volume (hereinafter referred to as a restore process).

The restore process is performed by the restore operation unit 55 in the sub storage system 2. Although both the host adaptors 201 and 202 include the restore operation unit 55, the restore operation unit 55 in either of the host adaptors 201 and 202 may perform the restore process. It is assumed here that the restore operation unit 55 in the host adaptor 201 performs the restore process, and the restore operation unit 55 hereinafter indicates the restore operation unit 55 in the host adaptor 201, unless otherwise noted.

The restore process is performed immediately after the process of acquiring the update data described above is completed. Accordingly, the HDD in the update data group in the sub storage system 2 is turned on during the restore process.

The restore process is started from Step S401.

In Step S402, the process selects one update data group in the sub storage system 2 as a target of the restore process. The selected update data group is called a target update data group.

In Step S403, the process determines whether the restore process is performed for the target update data group. This determination is based on the usage rate of the target update data group (in the sub storage system 2), the state of the power supply of the HDD in the target update data group, and the state of the power supply of the sub logical volume associated with the target update data group.

The usage rate of the update data group is calculated from the write address and read address of the target update data group recorded in the update data group progress information 208 and the maximum amount of the update data that can be recorded in the target update data group. If the usage rate calculated in this manner exceeds the sub threshold value of the target update data group recorded in the update data group management information 206, the restore process is performed for the update data group.

However, if the HDD which forms any of the sub logical volumes associated with the target update data group is turned on, the restore process is performed for the sub logical volume, irrespective of the usage rate of the target update data group, to decrease the number of times the HDD is turned on/off.

In Step S404, the process proceeds to Step S405 if the process determines in Step S403 that the restore process is performed for the target update data group. Otherwise, the process proceeds to Step S410.

In Step S405, the process reads out the update data recorded in the update data logical volume in the target update data group into the cache memory. This step is substantially similar to the step in which the main storage system 1 reads out the update data from the main update data logical volume to transfer the update data to the sub storage system 2 in the process of acquiring the update data in Step S306 in FIG. 18. The restore operation unit 55 reads out the update data that is recorded in the sub update data logical volume in the target update data group and that is subsequent to the update data most recently read out.

In Step S406, the process identifies a sub logical volume to be updated from the update data header of the readout update data and determines whether the update data is applied to the sub logical volume (the restore process). Although it is necessary to turn on the HDD for the restore process if the HDD which forms the sub logical volume is turned off, it is not preferable to excessively repeat the turning on/off of the HDD, as described above. Accordingly, the restore process is performed for the sub logical volume to which the HDD that is turned on is allocated, whereas the restore process is deferred for the sub logical volume to which the HDD that is turned off is allocated if no update data more than a predetermined amount (which can be set by the user) exists and a predetermined recovery point objective (RPO) (which can be set by the user) is not reached.

In addition, update of the data may be performed in the same order as in the writing of the data between the multiple sub logical volumes in the update data group to ensure the time consistency in the data. In this case, the application of the update data to the sub logical volume is always performed in the order in which the update data is recorded in the update data logical volume. Furthermore, there is a case in which the HDD which forms the sub logical volume to be updated with the in-process update data is turned off in the application of the update data in the update data group. In this case, the update data transfer arbitration unit 53 determines whether the subsequent application of the update data in the update data group is deferred or the HDD that is turned off is turned on to continue the application of the update data. This determination is based on the amount of the update data.

The update data header includes the pair ID (refer to FIG. 15). The pair ID can be used to acquire the ID of the sub logical volume in the pair from the pair information 207.

In Step S407, the process proceeds to Step S408 if the process determines in Step S406 that the restore process is performed for the sub logical volume. Otherwise, the process proceeds to Step S409.

In Step S408, the process performs update of the data for the sub logical volume on the basis of the content of the update data. The step will now be described in detail.

The restore operation unit 55 instructs the HDD power supply control unit 56 in the disk adaptor 209 to turn on the HDD, if the HDD which forms the sub logical volume, which is the target for the restore process, is turned off.

The HDD power supply control unit 56 in the disk adaptor 209 identifies the HDD which forms the specified logical volume and turns on the HDD. The HDD power supply control unit 56 refers to the logical volume management information 205 for the identification.

The restore operation unit 55 instructs the logical volume control unit 57 in the disk adaptor 209 to update the data in the sub logical volume on the basis of the update data recorded in the cache memory 210 in Step S405. Parameters used in this instruction include the address at which the update data is recorded in the cache memory 210 and the ID of the sub logical volume. The logical volume control unit 57 in the disk adaptor 209 writes the write data, included in the update data recorded in the cache memory 210, in the sub logical volume specified by the above ID from the address recorded in the update data.

In Step S409, the process determines whether the usage rate of the target update data group is lower than or equal to a predetermined value, for example, 5% (which can be set by the user) as a result of the application of the update data to the sub logical volume. If the usage rate is higher than the predetermined value, the process goes back to Step S405 to perform the restore process for the remaining update data.

In Step S410, the process performs Steps S402 to S409 for all the update data groups in the sub storage system 2. Specifically, in Step S410, the process determines whether Steps S402 to S409 are performed for all the update data groups in the sub storage system 2. If Steps S402 to S409 are performed for all the update data groups in the sub storage system 2, the process proceeds to Step S411. If Steps S402 to S409 are not performed for all the update data groups in the sub storage system 2, the process goes back to Step S403.

In Step S411, the restore process terminates.

Figure 20:
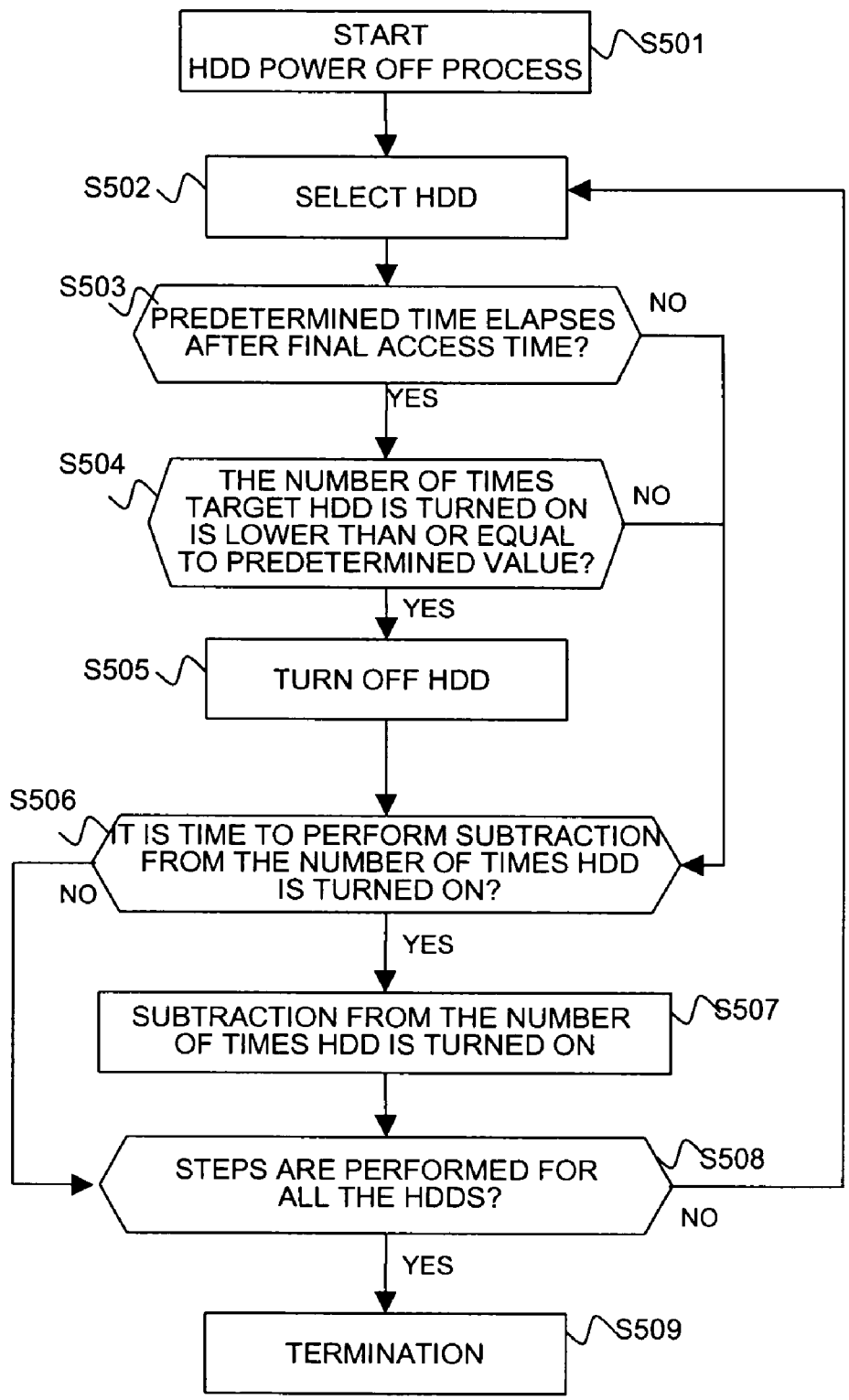
FIG. 20 is a flowchart showing a process of turning off an HDD.

FIG. 20 is a flowchart showing a process of periodically turning off the HDD (HDD power off process). This process is performed by the HDD power supply control unit 56 in the disk adaptor 209 in the sub storage system 2. Similar process may be performed in the main storage system 1.

The HDD power off process is performed for all the HDDs in the sub storage system 2 at predetermined time intervals.

The HDD power off process is started from Step S501.

In Step S502, the process selects the ID of the HDD, which is the target of the HDD power off process, from the HDD IDs recorded in the HDD power supply control information 225. Steps S502 to S507 is a loop process for all the HDD IDs recorded in the HDD power supply control information 225. Different HDD IDs are selected each time the process returns to the beginning of the loop in the order in which the HDD IDs are recorded in the HDD power supply control information 225. The selected HDD is called a target HDD.

In Step S503, the process determines whether a predetermined time, for example, 15 minutes (which can be set by the user) elapses from the time when the target HDD has been finally accessed. This determination is based comparison between the final access time recorded in the HDD power supply control information 225 and the current time. If the predetermined time elapses, the process proceeds to Step S504. Otherwise, the process proceeds to Step 506.

In Step S504, the process determines whether the number of times the target HDD is turned on, recorded in the HDD power supply control information 225, is lower than or equal to a predetermined value, for example, four (which can be set by the user). If the number of times is lower than or equal to the predetermined value, the process proceeds to Step S505. Otherwise, the process proceeds to Step S506. The object of Step S504 is to prevent excessive repetition of turning on/off of the HDD. The information concerning the number of times the HDD is turned on in the HDD power supply control information 225 is recorded in order to restrict the number of times the HDD is turned on. One is added to the information each time the HDD is turned on and one is subtracted at predetermined time intervals, for example, every two hours (which can be set by the user).

In Step S505, the process turns off the target HDD.

In Step S506, the process determines whether it is time to subtract one from the value recorded in the information concerning the number of times the HDD is turned on in the HDD power supply control information 225. If it is time to subtract one from the value, the process proceeds to Step S507. Otherwise, the process proceeds to Step S508. This determination is performed by a method of, for example, checking whether an even-numbered time (for example, 14:00) is exceeded.

In Step S507, the process subtracts one from the value recorded in the information concerning the number of times the target HDD is turned on in the HDD power supply control information 225.

In Step S508, the process determines whether Steps S503 to S507 have been performed for all the HDDs recorded in the HDD power supply control information 225. If Steps S503 to S507 have been performed for all the HDDs recorded in the HDD power supply control information 225, then in Step S509, the HDD power off process terminates. Otherwise, the process goes back to Step S502 to select the subsequent HDD.

Second Embodiment

A second embodiment of the present invention will be described with reference to FIG. 21.

Figure 21:
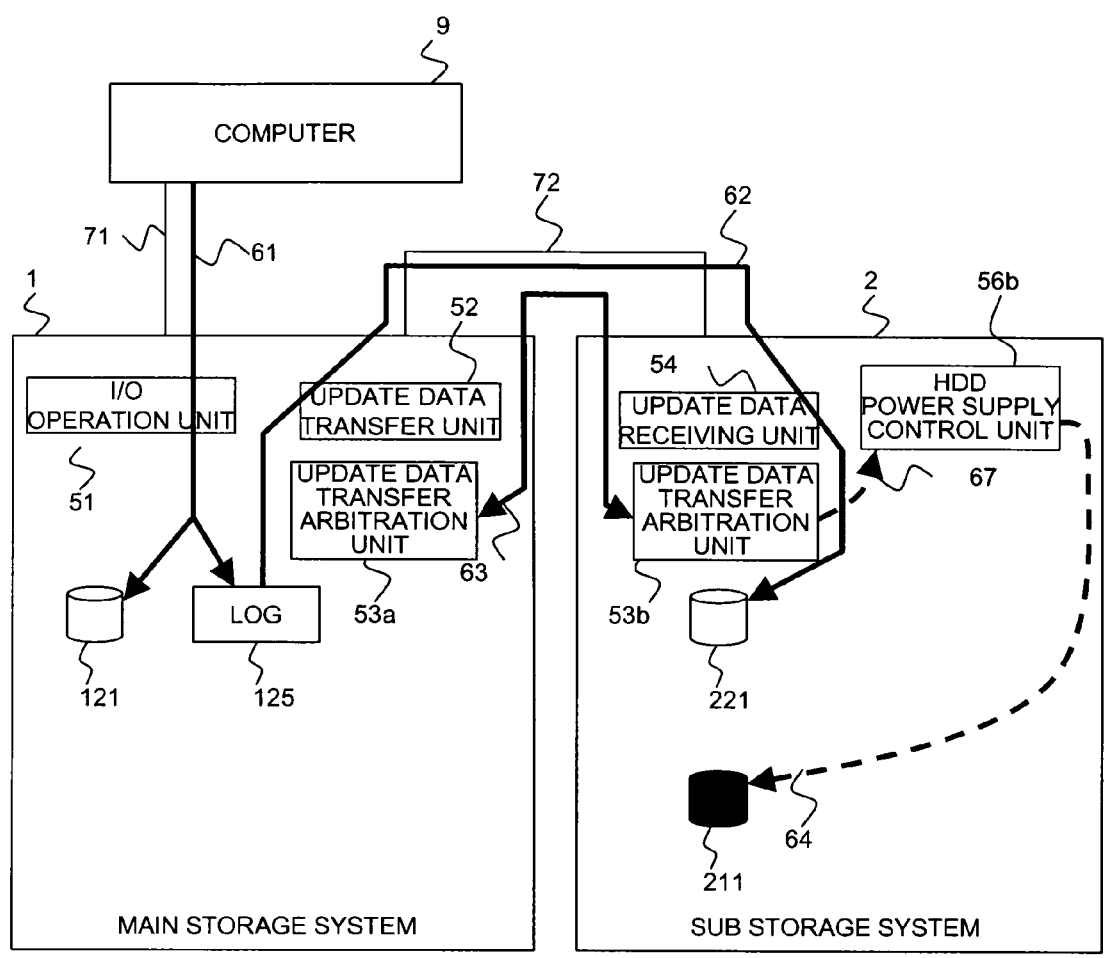
FIG. 21 shows an example of the logical structure of a computer system according to a second embodiment of the present invention.

FIG. 21 shows an example of the logical structure of a computer system according to the second embodiment of the present invention. Only the difference between the first embodiment and the second embodiment is described below.

According to the second embodiment of the present invention, the asynchronous remote copy, which does not use the update data logical volume, is used. The I/O operation unit 51 in the second embodiment does not generate the update data in response to the request to write the data from the computer 9. Instead of generating the update data, the I/O operation unit 51 records the data to be written and the information concerning the address in the main logical volume 121, to which the data is recorded, in a log 125 in the cache memory 110 in the writing of the data in the main logical volume 121.

The update data is generated by the update data transfer unit 52 in the main storage system 1 in the transfer of the update data from the main storage system 1 to the sub storage system 2. The update data transfer unit 52 generates the update data from the data recorded in the log 125 and the main storage system 1.

The timing when the update data is transferred is determined on the basis of the usage rate of the update data logical volume in the first embodiment. In contrast, according to the second embodiment of the present invention, the update data is transferred at a timing when the ratio of the data updated in response to the request from the computer 9 after the update data is previously transferred to the sub storage system 2, among the data recorded in the main logical volume 121, with reference to the total amount of the data exceeds a predetermined value. The log 125 is referred to to determine the ratio of the updated data in the main logical volume 121.

At the timing when the update data is transferred, the update data transfer arbitration unit 53a in the main storage system 1 indicates to the update data transfer arbitration unit 53b in the sub storage system 2 that transfer of the update data is started. Upon reception of the indication, the update data transfer arbitration unit 53b in the sub storage system 2 turns on the HDD which forms the sub logical volume 221, which is a target of the update data (if the HDD is turned off) (broken-line arrows 67 and 64).

The update data generated from the data recorded in the log 125 and the main logical volume 121 is transmitted by the update data transfer unit 52 in the main storage system 1 and is received by the update data receiving unit 54 in the sub storage system 2. The data in the update data, transmitted from the main logical volume 121, is recorded in the sub logical volume 221.

Or, the sub storage system 2 may indicate, to the main storage system 1, the pair whose update data is desirably transferred by priority in response to the above indication in order to apply the update data by priority to the sub logical volume to which the HDD that is turned on is allocated. Alternatively, the sub storage system 2 may indicate to the main storage system 1 the pair whose update data is desirably transferred by priority or the pair whose update data is not desirably transferred by priority before the timing when the update data is transferred. This indication is provided at the moment when the HDD which forms the sub logical volume is turned on or off. For example, such a situation arises when the superior device, such as the computer 9, accesses another logical volume in the HDD group which forms the sub logical volume.

Third Embodiment

A third embodiment of the present invention will be described with reference to FIG. 22.

Figure 22:
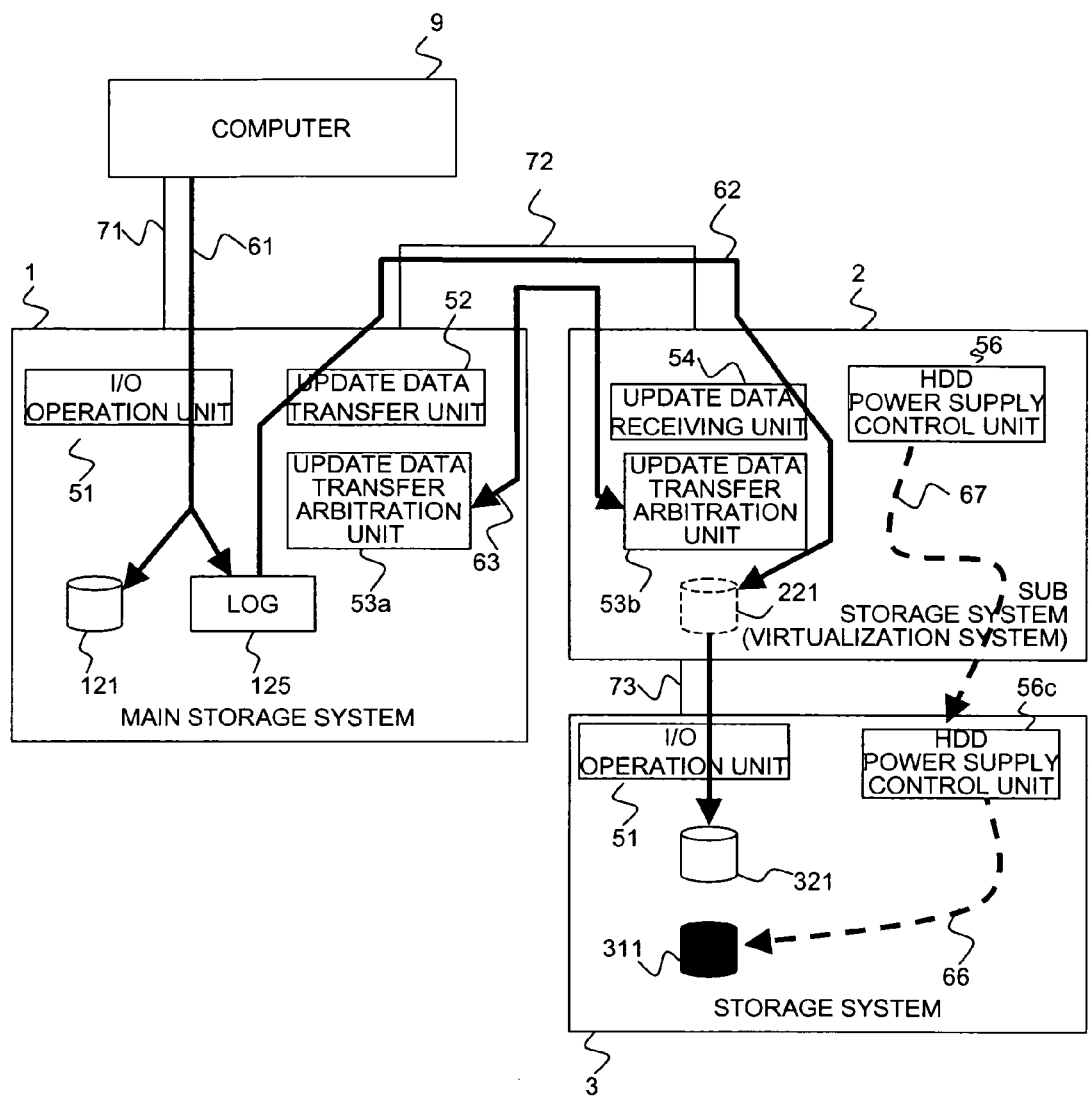
FIG. 22 shows an example of the logical structure of a computer system according to a third embodiment of the present invention.

FIG. 22 shows an example of the logical structure of a computer system according to the third embodiment of the present invention.

The computer system according to the third embodiment of the present invention differs from the computer system according to the second embodiment of the present invention in that the computer system has a virtualization function in the sub storage system 2 (hereinafter denoted as a storage system (2)). The virtualization function is a function of forming a virtual logical volume from one logical volume or multiple logical volumes in an external storage system. Access to the virtual logical volume is realized by the storage system (2) that submits a request to the external storage system as an access request to an external logical volume in the storage system (2). The sub virtual logical volume 222 in the storage system (2) is a virtual volume formed of a logical volume 321 in a storage system 3 (hereinafter denoted as a storage system (3)). A communication path 73 is provided between the storage system (2) and the storage system (3).

According to the third embodiment of the present invention, the HDD power supply control unit 56 in the storage system (2) requests the storage system (3) to perform power supply control for the logical volume 321 forming the virtual logical volume 222 upon reception of a request for the power supply control (turning off or on of the power) of the virtual logical volume 222 (a broken-line arrow 67). The storage system (3) includes an HDD power supply control unit 56c that controls the power supply to the HDD 311 which forms the logical volume 321 in response to the request for the power supply control (a broken-line arrow 66).

The storage system (2) may be replaced with a virtualization system that includes no HDD but has only the virtualization function. Alternatively, as in the first embodiment, the remote copy using the update data logical volume may be used to operate the update data logical volume, the sub logical volume, or both of the update data logical volume and the sub logical volume as the virtual logical volume.

Although the transfer of the update data is started in response to the request from the sub storage system 2 in the first embodiment, the main storage system 1 may indicate to the sub storage system 2 that the update data is to be transferred before starting the transfer of the update data. Alternatively, the main storage system 1 may transfer the update data to the sub storage system 2 without indicating the transfer of the update data to the sub storage system 2.

According to the embodiments of the present invention, a timing when the update data is transferred is mainly determined on the basis of the amount of data. The determination of the timing may be based on calculation of the rate of increase of the amount of data, in addition to the amount of data at a certain time. Or, the relationship between the amount of data, the rate of increase of the amount of data, and time may be statistically calculated to calculate a time when the HDD is efficiently turned on in order to efficiently perform the power supply control of the HDD. Alternatively, the user may set a time when the HDD is turned on in the storage system in advance and the storage system may turn on the HDD at the set time.

In addition, the update data may be transferred at a time when the user changes the pair state. Or, when the user determines that the data will not be written in the main logical volume 121 from the computer 9 for a time, a mechanism of instructing the main storage system 1 and the sub storage system 2 to transfer the update data may be provided. Alternatively, it is preferable that the sub storage system 2 always receive the update data at a certain time or at predetermined time intervals to prevent the RPO from being too old.

Although the timing when the HDD is turned off is determined on the basis of the presence of access to the HDD in the embodiments of the present invention, the HDD may be turned off upon completion of the process in FIG. 18 or 19 (upon completion of the writing of the data in the sub update data logical volume or the sub logical volume).

What is claimed is:

1. A computer system comprising:
a first storage system that includes a first logical volume and a first processing unit;
a second storage system coupled with the first storage system and that includes a second logical volume, a third logical volume, an arbitration unit, a power supply control unit to control a power supply of a storage device forming said second logical volume, and a second processing unit; and
a computer coupled with the first storage system,
wherein the computer includes a transmitter that transmits data to the first storage system,
wherein the first processing unit records the data transmitted from the computer in the first logical volume and generates update data including the data,
wherein the arbitration unit determines whether the update data is received from the first storage system;
wherein, if the arbitration unit determines that the update data is received from the first storage system and the storage device which forms the second logical volume is turned off, the arbitration unit transmits an instruction to the power supply control unit to control the power supply to turn on the storage device to thereby activate the second logical volume;
wherein the arbitration unit records the update data in the activated second logical volume,
wherein the second processing unit reads the update data recorded in the second logical volume and records the read update data in the third logical volume.

2. The computer system according to claim 1,
wherein the timing when the second processing unit reads the update data recorded in the second logical volume and records the read update data in the third logical volume is determined on the basis of an amount of the update data recorded in the second logical volume.

3. The computer system according to claim 1,
wherein the first storage system further includes a fourth logical volume that records the update data, and
wherein the timing when the fourth logical volume receives the update data from the first logical volume is determined on the basis of an amount of the update data recorded in the fourth logical volume.

4. The computer system according to claim 1,
wherein the first logical volume and the third logical volume form a pair, and wherein the timing when the third logical volume receives the update data from the first logical volume is determined on the basis of a state of the pair.

5. The computer system according to claim 1,
wherein, when the arbitration unit determines whether the update data is received from the first storage system, the arbitration unit refers a state of power supply to the storage device.

6. The computer system according to claim 1,
wherein the power supply control unit in the second storage system turns OFF the storage device at a timing when the storage device is to be turned OFF.

7. The computer system according to claim 1,
wherein the power supply control unit in the second storage system turns OFF the storage device at a timing when the storage device is to be turned OFF, and
wherein the timing when the storage device is turned OFF is determined on the basis of a final access time to the storage device or the number of times the storage device is turned ON.

8. A computer system comprising:
a first storage system that includes a first logical volume, a first processing unit and a transmitting unit;
a second storage system coupled with the first storage system and that includes a second logical volume, a power supply control unit to control a power supply of a storage device forming said second logical volume, and an arbitration unit; and
a computer coupled with the first storage system,
wherein the computer includes a transmitter that transmits data to the first storage system,
wherein the first processing unit records the data transmitted from the computer in the first logical volume and a transmitting unit generates update data including the data and transmits the generated update data to the second storage system,
wherein the arbitration unit determines whether the update data is received from the first storage system;
wherein, if the arbitration unit determines that the update data is received from the first storage system and the storage device which forms the second logical volume is turned OFF, the arbitration unit transmits an instruction to the power supply control unit to control the power supply to turn ON the storage device to thereby activate the second logical volume; and
wherein the arbitration unit records the update data in the activated second logical volume.

9. The computer system according to claim 8,
wherein when the arbitration unit determines whether the update data is received from the first storage system, the arbitration unit refers a ratio of updated data with reference to the data recorded in the first logical volume exceeds a predetermined value.

10. The computer system according to claim 8, further comprising:
an external storage system coupled with the second storage system,
wherein the second logical volume in the second storage system forms a virtual logical volume for a logical volume in the external storage system,
wherein the power supply control unit in the second storage system requests controlling of power supply to the logical volume in the external storage system upon reception of a request for power supply control of the virtual logical volume, and
wherein a power supply control unit in the external storage system controls power supply to a storage device which forms the logical volume.

11. A method of reproducing data for a computer system comprising:
a first storage system that includes a first logical volume and a first processing unit;
a second storage system coupled with the first storage system and that includes a second logical volume, a third logical volume, an arbitration unit, a power supply control unit to control a power supply of a storage device forming said second logical volume, and a second processing unit; and
a computer coupled with the first storage system,
wherein the computer includes a transmitter that transmits data to the first storage system,
wherein the first processing unit records the data transmitted from the computer in the first logical volume and generates update data including the data,
wherein the arbitration unit determines whether the update data is received from the first storage system;
wherein, if the arbitration unit determines that the update data is received from the first storage system and the storage device which forms the second logical volume is turned off, the arbitration unit transmits an instruction to the power supply control unit to control the power supply to turn on the storage device to thereby activate the second logical volume;
wherein the arbitration unit records the update data in the activated second logical volume, and
wherein the second processing unit reads the update data recorded in the second logical volume and records the read update data in the third logical volume.

12. The method according to claim 11,
wherein the timing when the second processing unit reads the update data recorded in the second logical volume and records the read update data in the third logical volume is determined on the basis of an amount of the update data recorded in the second logical volume.

13. The method according to claim 11,
wherein the first storage system further includes a fourth logical volume that records the update data, and
wherein the timing when the fourth logical volume receives the update data from the first logical volume is determined on the basis of an amount of the update data recorded in the fourth logical volume.

14. The method according to claim 11,
wherein the first logical volume and the third logical volume form a pair, and wherein the timing when the third logical volume receives the update data from the first logical volume is determined on the basis of a state of the pair.

15. The method according to claim 11,
wherein, when the arbitration unit determines whether the update data is received from the first storage system, the arbitration unit refers a state of power supply to the storage device.

16. The method according to claim 11,
wherein the power supply control unit in the second storage system turns OFF the storage device at a timing when the storage device is to be turned OFF.

17. The method according to claim 11,
wherein the power supply control unit in the second storage system turns OFF the storage device at a timing when the storage device is to be turned OFF, and
wherein the timing when the storage device is turned OFF is determined on the basis of a final access time to the storage device or the number of times the storage device is turned ON.

18. A method comprising:
a first storage system that includes a first logical volume, a first processing unit and a transmitting unit;
a second storage system coupled with the first storage system and that includes a second logical volume, a power supply control unit to control a power supply of a storage device forming said second logical volume, and an arbitration unit; and
a computer coupled with the first storage system,
wherein the computer includes a transmitter that transmits data to the first storage system,
wherein the first processing unit records the data transmitted from the computer in the first logical volume and a transmitting unit generates update data including the data and transmits the generated update data to the second storage system,
wherein the arbitration unit determines whether the update data is received from the first storage system;
wherein, if the arbitration unit determines that the update data is received from the first storage system and a storage device which forms the second logical volume is turned OFF, the arbitration unit transmits an instruction to the power supply control unit to control the power supply to turn ON the storage device to thereby activate the second logical volume; and
wherein the arbitration unit records the update data in the second logical volume.

19. The method according to claim 18,
wherein when the arbitration unit determines whether the update data is received from the first storage system, the arbitration unit refers a ration of updated data with reference to the data recorded in the first logical volume exceeds a predetermined value.

20. The method according to claim 18, further comprising:
an external storage system coupled with the second storage system,
wherein the second logical volume in the second storage system forms a virtual logical volume for a logical volume in the external storage system,
wherein the power supply control unit in the second storage system requests controlling of power supply to the logical volume in the external storage system upon reception of a request for power supply control of the virtual logical volume, and
wherein a power supply control unit in the external storage system controls power supply to a storage device which forms the logical volume.

21. The computer system according to claim 1 wherein the power supply control unit controls a power supply of a second storage device forming said third logical volume, and wherein, if the arbitration unit determines that a usage rate of the second logical volume is equal to or greater than a predetermined threshold value, the arbitration unit transmits an instruction to the power supply control unit to control the power supply for the second storage device forming said third logical volume to turn on the second storage device to thereby activate the third logical volume to record the update data.

22. A method according to claim 11 wherein the power supply control unit controls a power supply of a second storage device forming said third logical volume, and wherein, if the arbitration unit determines that a usage rate of the second logical volume is equal to or greater than a predetermined threshold value, the arbitration unit transmits an instruction to the power supply control unit to control the power supply for the second storage device forming said third logical volume to turn on the second storage device to thereby activate the third logical volume to record the update data.

* * * * *